(12) United States Patent
Kim et al.

(10) Patent No.: US 8,754,670 B2
(45) Date of Patent: Jun. 17, 2014

(54) REAL TIME RECONFIGURABLE LOGIC DEVICE AND SEMICONDUCTOR PACKAGE HAVING THE SAME

(75) Inventors: Ho-jung Kim, Gyeonggi-do (KR);
Jae-kwang Shin, Gyeonggi-do (KR);
Hyun-sik Choi, Gyeonggi-do (KR);
Hyun-su Jeong, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/494,477

(22) Filed: Jun. 12, 2012

(65) Prior Publication Data

US 2012/0326748 A1 Dec. 27, 2012

(30) Foreign Application Priority Data

Jun. 27, 2011 (KR) .................. 10-2011-0062480

(51) Int. Cl.
*H03K 19/173* (2006.01)

(52) U.S. Cl.
USPC .................. 326/38; 326/39; 326/41

(58) Field of Classification Search
None
See application file for complete search history.

(56) References Cited

U.S. PATENT DOCUMENTS

| | | | |
|---|---|---|---|
| 6,091,263 A * | 7/2000 | New et al. .................. | 326/40 |
| 6,188,240 B1 | 2/2001 | Nakaya | |
| 6,282,019 B1 | 8/2001 | Kapitza | |
| 6,288,566 B1 * | 9/2001 | Hanrahan et al. ............ | 326/38 |
| 6,542,000 B1 | 4/2003 | Black et al. | |
| 7,102,386 B2 | 9/2006 | Leijten-Nowak | |
| 7,129,749 B1 | 10/2006 | Fenstermaker et al. | |
| 7,218,137 B2 * | 5/2007 | Vadi et al. .................. | 326/38 |
| 7,486,109 B2 | 2/2009 | Sasao et al. | |
| 7,518,396 B1 | 4/2009 | Kondapalli et al. | |
| 7,598,769 B2 | 10/2009 | Leung | |
| 7,840,630 B2 * | 11/2010 | Wong et al. .................. | 708/708 |
| 2004/0117755 A1 | 6/2004 | Blodget et al. | |

FOREIGN PATENT DOCUMENTS

| | | |
|---|---|---|
| EP | 1519489 A1 | 3/2005 |
| JP | 2008219883 A | 9/2008 |
| KR | 20050059081 A | 6/2005 |

OTHER PUBLICATIONS

Ullmann et al., 2004, FPGA Run-Time System for Dynamical On-Demand Reconfiguration, Proceedings of the 18th International Parallel and Distributed Processing Symposium (IPDPS'04), IEEE Computer Society.*

(Continued)

*Primary Examiner* — Alexander H Taningco
*Assistant Examiner* — Nelson Correa
(74) *Attorney, Agent, or Firm* — Harness, Dickey & Pierce, P.L.C.

(57) ABSTRACT

According to example embodiments, a logic device includes a first functional block configured to perform a first operation according to first operation information and a second operation according to second operation information, and a second functional block configured to perform a third operation according to the first operation information and a fourth operation according to the second operation information. The first functional block is configured to receive configuration information, to select one of the first operation information and the second operation information based on the configuration information, and to perform the first or second operation based on the selected first or second operation information. The second functional block is configured to receive the configuration information, to select one of the first operation information and the second operation information based on the configuration information, and to perform the third or fourth operation based on the selected first or second operation information.

33 Claims, 17 Drawing Sheets

(56) References Cited

OTHER PUBLICATIONS

Fairchild Semiconductor, "DM74LS181 4-Bit Arithmetic Logic Unit," 1988.*

Altera, 2010, MAX V Device Handbook.*

Xilinx, 1996, The Programmable Logic Data Book, XC9500 In-System Programmable CPLD Family.*

European Search Report dated Oct. 22, 2013 for corresponding European Application No. 12173626.8.

* cited by examiner

REAL TIME RECONFIGURABLE LOGIC DEVICE AND SEMICONDUCTOR PACKAGE HAVING THE SAME

CROSS-REFERENCE TO RELATED APPLICATIONS

This application claims priority under 35 U.S.C. §119 to Korean Patent Application No. 10-2011-0062480, filed on Jun. 27, 2011, in the Korean Intellectual Property Office, the disclosure of which is incorporated herein in its entirety by reference.

BACKGROUND

1. Field

Example embodiments relate to a logic device and a semiconductor package including the same, and more particularly, to a logic device that is reconfigurable in real time by using a non-volatile memory device.

2. Description of the Related Art

Recently, the use of reconfigurable logic devices, e.g., a programmable logic device (PLD) that can be easily and arbitrarily designed by a user, has become widespread. A user may reconfigure a logic device to perform a desired operation by controlling signal routings among interconnection lines included in the logic device.

SUMMARY

Example embodiments relate to a logic device that is reconfigurable quickly and a semiconductor package including the same.

Additional aspects will be set forth in part in the description which follows and, in part, will be apparent from the description, or may be learned by the practice of example embodiments.

According to example embodiments, a logic device includes a first functional block and a second functional block. The first functional block is configured to perform a first operation according to first operation information and to perform a second operation according to second operation information. The first functional block is configured to receive configuration information and select one of the first operation information and the second operation information based on the configuration information, and to perform the one of the first and the second operation based on the selected one of the first and second operation information. The second functional block is configured to perform a third operation according to the first operation information and to perform a fourth operation according to the second operation information. The second functional block is configured to receive the configuration information and to select one of the first operation information and the second operation information based on the configuration information, and to perform the one of the third and fourth operation based on the selected one of the first and second operation information.

The first functional block may be configured to receive a first input signal containing the configuration information, and to generate a first output signal according to the one of the first operation and the second operation.

The first functional block may include a plurality of first storage devices. The first functional block may be configured to perform first operation using a part of the plurality of first storage devices, and the first functional block may be configured to perform the second operation using a second part of the plurality of first storage devices.

The second functional block may be configured to receive a second input signal containing the configuration information, generate a second output signal according to the one of the third operation and the fourth operation. The second functional block may include a plurality of second storage devices. The second functional block may be configured to perform the third operation using a first part of the plurality of second storage devices, and to perform the fourth operation using a second part of the plurality of second storage devices.

Each of the plurality of first storage devices may include a plurality of reconfigurable non-volatile memory devices.

The plurality of reconfigurable non-volatile memory devices may be arranged in an array.

The logic device may further include an interconnection unit configured to connect the first functional block and the second functional block based on a plurality of pieces of interconnection information. The interconnection unit may be configured to receive the configuration information, select one piece of interconnection information from among the plurality of pieces of interconnection information, and to connect the first functional block and the second functional block based on the selected interconnection information.

The interconnection unit may include a switch device configured to connect the first functional block and the second functional block according to a control signal, and a configuration unit configured to generate the control signal.

The configuration unit may include a plurality of third storage devices configured to store the plurality of pieces of interconnection information. The plurality of third storage devices may include a plurality of non-volatile memory devices.

The configuration unit may further include a selector connected to the plurality of third storage devices. The selector may be configured to select one of the plurality of third storage devices based on the configuration information so as to read the plurality of pieces of interconnection information.

The configuration unit may further include a latch configured to read the plurality of pieces of interconnection information from the plurality of third storage devices and to store the read interconnection information of the plurality of pieces of interconnection information.

The latch may include a first inverter including a first pull-up transistor connected to a power supply voltage terminal and a first pull-down transistor connected in series to the first pull-up transistor; a second inverter including a second pull-up transistor connected to the power supply voltage terminal and a second pull-down transistor connected in series to the second pull-up transistor, wherein the second inverter and the first inverter are cross-linked to each other; and an equalizer configured to connect a gate of the first pull-down transistor and a gate of the second pull-down transistor, based on an enable bar signal.

A control terminal of the switch device may be connected to a node between the first pull-up transistor and the first pull-down transistor.

The plurality of third storage devices may be connected between a source of the first pull-down transistor and a ground voltage terminal.

The configuration unit may further include a bias transistor connected between a source of the second pull-down transistor and the ground voltage terminal.

According to example embodiments, a semiconductor package includes a semiconductor chip containing the foregoing logic device and a printed circuit board (PCB) on which the semiconductor chip is mounted.

The PCB may include an external terminal configured to receive the configuration information.

The logic device may be one of a field programmable gate array (FPGA), a programmable array logic (PAL), a programmable logic array (PLA), and a generic array logic (GAL).

According to example embodiments, a logic device includes a plurality of logic blocks. Each of the plurality of logic blocks include a plurality of functional blocks. Each of the functional blocks is configured to perform a plurality of operations according to a plurality of pieces of operation information. Each of the functional blocks is configured to receive configuration information, select a piece of operation information from among the plurality of pieces of operation information based on the configuration information, and to perform one of the plurality of operations based on the selected operation information.

Each of the plurality of logic blocks may include at least one interconnection unit configured to connect the plurality of functional blocks based on a plurality of pieces of interconnection information. The interconnection unit may be configured to receive the configuration information, to select a piece of interconnection information from among the plurality of pieces of interconnection information based on the configuration information, and to connect the plurality of functional blocks based on the selected interconnection information.

The interconnection unit may include a first switch device and a first configuration unit. The first configuration unit may include a plurality of storage devices configured to store the plurality of pieces of interconnection information, and a selector connected to the plurality of storage devices. The selector may be configured to select one of the plurality of storage devices based on the configuration information to read the plurality of pieces of interconnection information.

The logic device may further include a connection block including a plurality of connection units configured to connect the plurality of logic blocks, based on a plurality of pieces of connection information. Each of the plurality of connection units may be configured to receive the configuration information, to select one piece of connection information from among the plurality of pieces of connection information based on the configuration information, and to connect the plurality of logic blocks based on the selected connection information.

Each of the plurality of connection units may include a second switch device and a second configuration unit. The second configuration unit may include a plurality of storage devices configured to store the plurality of pieces of connection information, and a selector connected to the plurality of storage devices. The selector may be configured to select one of the plurality of storage devices based on the configuration information to read the plurality of pieces of connection information.

The logic device may further include a plurality of connection blocks configured to connect the plurality of logic blocks, and a routing block including a plurality of routing units configured to connect the plurality of connection blocks based on a plurality of pieces of routing information. Each of the plurality of routing units may be configured to receive the configuration information, to select a piece of routing information from among the plurality of pieces of routing information based on the configuration information, and to connect the plurality of connection blocks based on the selected routing information.

Each of the plurality of routing units may include a first transmission unit configured to transmit a signal in a direction from a first terminal to a second terminal, and a second transmission unit configured to transmit a signal in a direction from the second terminal to the first terminal.

Each of the first transmission unit and the second transmission unit may include a third configuration unit. The third configuration unit may include a plurality of storage devices configured to store the plurality of pieces of routing information, and a selector connected to the plurality of storage devices. The selector may be configured to select one of the plurality of storage devices based on the configuration information to read the plurality of pieces of routing information.

According to example embodiments, a semiconductor package includes a semiconductor chip including a logic device; and a printed circuit board (PCB) on which the semiconductor chip is mounted. The logic device includes a connection block including a connection unit configured to connect a plurality of logic blocks based on a plurality of pieces of connection information. The connection unit is configured to receive configuration information, to select a piece of connection information from among the plurality of pieces of connection information based on the configuration information, and to connect the plurality of logic blocks based on the selected connection information.

According to example embodiments, a logic device includes at least one logic block that includes a first functional block adjacent to a second functional block. The first and second functional blocks are configured to store data in a storage device, to receive an input signal containing configuration information, perform at least one operation using a part of the storage device, the at least one operation selected from a plurality of operations based on the configuration information, and generate an output signal according to the last one operation performed.

The input signal may further include external information. The first and second functional blocks may each be configured to select the part of the storage device used to perform at least one operation based on the configuration information, and the first and second functional blocks are each configured to access a portion of data in the selected part of the storage device, the portion of data being selected based on the external information contained in the input signal. The first and second functional blocks are each configured to output the portion of data accessed as the output signal.

At least one of the first and second functional blocks are configured to receive the input signal as an 8-bit signal containing the configuration information as a 2-bit signal, and to perform one of a ECC operation, an ALU operation, a compression operation, and a security operation in response to the 2-bit signal of configuration information.

The storage device of the at least one of the first and second functional blocks may include a plurality of reconfigurable non-volatile memory devices separated into first to fourth groups. The at least one of the first and second functional blocks may be configured to use the first group for performing the ECC operation, the second group for performing the ALU operation, the third group for performing the compression operation, and the fourth group for performing the security operation.

The first and second functional blocks may be each configured to receive the input signal containing the configuration information as a 1-bit signal, and to perform two operations in response to the 1-bit signal of configuration information.

Each logic may further include an interconnection unit that is configured to connect the first and second functional blocks based on a plurality of pieces of interconnection information. The interconnection unit may be configured to receive the configuration information, to select one piece of interconnection information from among the plurality of pieces of interconnection information, and to connect the first and second functional blocks based on the selected piece of interconnection information.

The logic device may include a plurality of the logic blocks, and further include a plurality of connection blocks including a plurality of connection units configured to connect the plurality of logic blocks, based on a plurality of pieces of connection information. Each of the plurality of plurality of connection units may be configured to receive the configuration information, to select one piece of connection information from among the plurality of pieces of connection information based on the configuration information, and to connect the plurality of logic blocks based on the selected connection information.

The logic device may include at least one routing block including a plurality of routing units configured to connect the plurality of connection blocks based on a plurality of pieces of routing information. Each of the plurality of routing units may be configured to receive the configuration information, to select a piece of routing information from among the plurality of pieces of routing information based on the configuration information, and to connect the plurality of connection blocks based on the selected routing information.

According to example embodiments, a semiconductor chip may include the foregoing logic device and at least one external terminal connected to the semiconductor chip and configured to receive the input signal containing configuration information.

BRIEF DESCRIPTION OF THE DRAWINGS

The foregoing and other features and advantages of example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
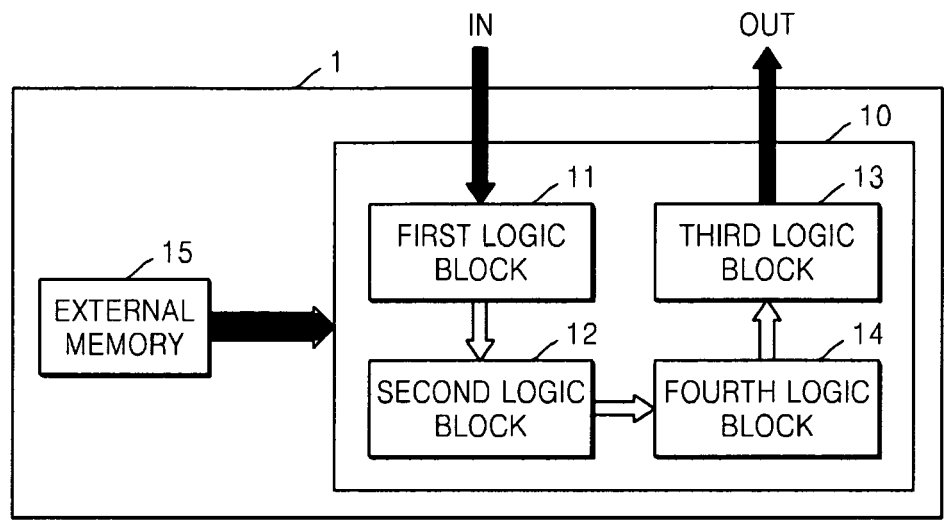
FIG. 1 is a schematic block diagram of an electronic circuit module including a general logic device and an external memory device.

Example embodiments will now be described more fully with reference to the accompanying drawings, in which some example embodiments are shown, wherein like reference numerals refer to like elements throughout. Example embodiments, may however, be embodiments in many forms and should not be construed as being limited to the embodiments set forth herein; rather, these embodiments are provided so that this disclosure will be thorough and complete and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from example embodiments.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

FIG. 1 is a schematic block diagram of an electronic circuit module 1 including a general logic device 10 and an external memory device 15. Referring to FIG. 1, the electronic circuit module 1 may include the logic device 10 having a plurality of logic blocks 11, 12, 13, and 14, and the external memory device 15. The logic device 10 is a programmable logic device (PLD), e.g., a field programmable gate array (FPGA), a programmable array logic (PAL), a programmable logic array (PLA), or a generic array logic (GAL). The external memory device 15 stores connection information regarding interconnections lines between the plurality of logic blocks 11 to 14 included in the logic device 10. The external memory device 15 may be, for example, flash memory or read-only memory (ROM).

When power is supplied to the electronic circuit module 1, the connection information stored in the external memory device 15 is loaded into the logic device 10. The plurality of logic blocks 11 to 14 are connected to one another based on the connection information. An operation of the logic device 10 is defined according to a connection between the plurality of logic blocks 11 to 14. Thus, in order to define an operation of the logic device 10, the connection information regarding the interconnection lines between the plurality of logic blocks 11 to 14 should be programmed, the programmed connection information should be stored in the external memory device 15, and the stored connection information should be loaded into the logic device 10. Thus, reconfiguring the logic device 10 in real time may be limited. Also, in order to operate the logic device 10, the external memory device 15 should be included in the logic device 10, which increases the size of the electronic circuit module 1 and manufacturing costs thereof.

Figure 2:
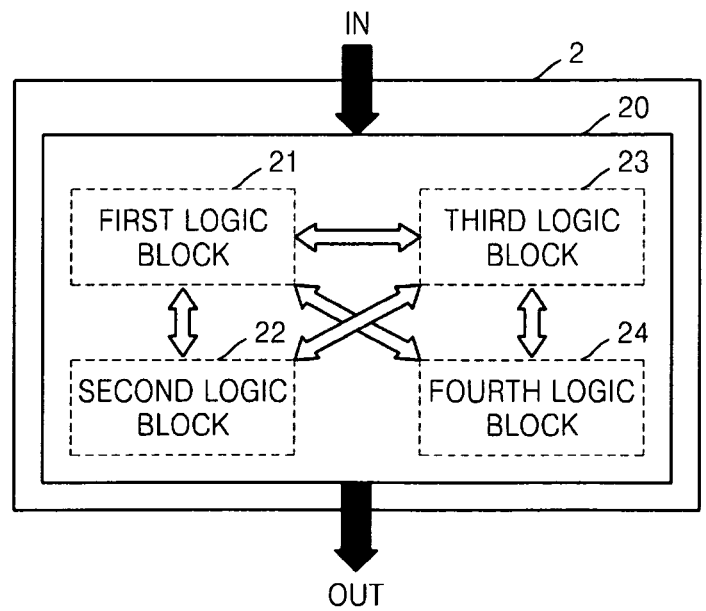
FIG. 2 is a schematic block diagram of an electronic circuit module including a logic device according to example embodiments.

FIG. 2 is a schematic block diagram of an electronic circuit module 2 including a logic device 20 according to example embodiments. Referring to FIG. 2, the electronic circuit module 2 may include a logic device 20 having a plurality of logic blocks 21, 22, 23, and 24. The logic device 20 may include a plurality of non-volatile memory devices (not shown). The plurality of non-volatile memory devices may be respectively disposed in regions where interconnection lines between the plurality of logic blocks 21 to 24 intersect one another or in regions where interconnection lines between a plurality of functional blocks (not shown) included in each of the plurality of logic blocks 21 to 24 intersect one another. Routing may be controlled between the interconnection lines between the plurality of logic blocks 21 to 24 or between the interconnection lines between the plurality of functional blocks included in each of the plurality of logic blocks 21 to 24 by writing, e.g., programming, data regarding the plurality of non-volatile memory devices, e.g., interconnection information, connection information, and routing information.

As described above, since the logic device 20 includes the plurality of non-volatile memory devices, the electronic circuit module 2 does not need an external memory device, unlike in the electronic circuit module 1. Thus, in order to redefine an operation of the logic device 20, e.g., in order to reconfigure the operation of the logic device 20, the connection information regarding the interconnection lines between the plurality of logic blocks 21 to 24 or between the plurality of functional blocks included in each of the plurality of logic blocks 21 to 24 may be programmed in the plurality of non-volatile memory devices in real time and the plurality of logic blocks 21 to 24 or the functional blocks included in each of the plurality of logic blocks 21 to 24 may be connected to one another based on the programmed connection information. Accordingly, the logic device 20 may be more easily reconfigured in real time, and may not include an external memory device, thereby reducing the size of the electronic circuit module 2.

Figure 3:
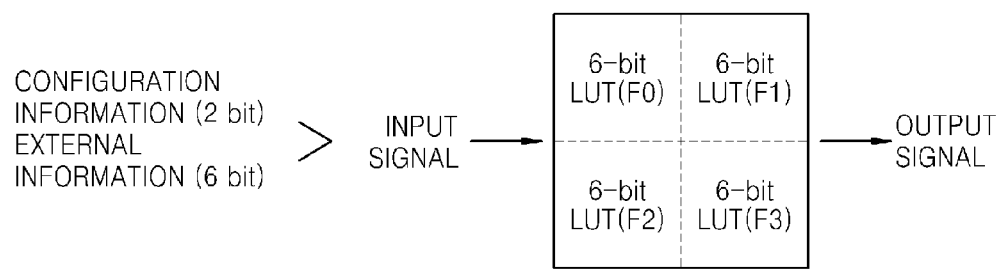
FIGS. 3 and 4 are schematic block diagrams respectively illustrating functional blocks included in a logic device, according to example embodiments.
Figure 4:
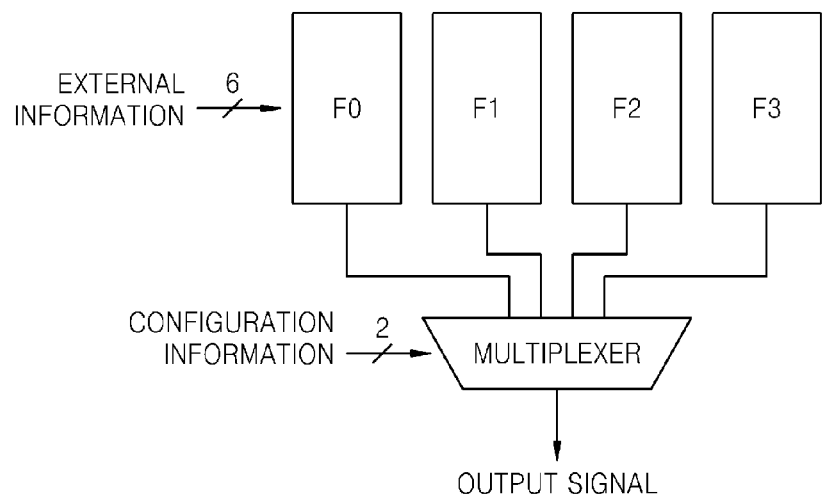

FIGS. 3 and 4 are schematic block diagrams respectively illustrating functional blocks 30 and 30a included in a logic device (not shown), according to example embodiments. The logic device may include a plurality of logic blocks, each of which may have a plurality of functional blocks 30. Here, the functional block 30 may be defined as a block that may be transformed from one data format to another data format.

More specifically, the functional block 30 may include a plurality of storage units (not shown), and may store all possible output signals related to an input signal in the plurality of storage units in the form of a table. The functional block 30 may perform an operation based on such information stored in the form of a table. For example, the functional block 30 may receive an input signal and access and output information stored in the form of a table according to the input signal. The functional block 30 may be embodied as an Intellectual Property (IP) block or a Look-Up Table (LUT) block. It is assumed in FIGS. 3 and 4 that the functional blocks 30 and 30a are LUT blocks.

Referring to FIG. 3, the functional block 30 may receive an input signal containing configuration information and may perform various operations based on the configuration information. In general, a functional block receives an input signal for performing one operation and outputs information accessed according to the input signal, as an output signal. However, it should be noted that the functional block 30 may receive an input signal for performing various operations, e.g., an input signal containing configuration information.

In other words, in the functional block 30 according to example embodiments (or a logic device including the functional block 30), each storage unit is divided into a configuration area and a data area. The functional block 30 receives the input signal containing the configuration information, accesses only the data region according to the configuration information, and outputs a result of the accessing as an output signal. Thus, according to example embodiments, the functional block 30 may perform various operations. For example, if the configuration information is a 2-bit signal, operation information may be defined as indicated in Table 1.

TABLE 1

| configuration information | Operation Information |
| --- | --- |
| 00 | error correction code (ECC) - first operation information |
| 01 | arithmetic and logic unit (ALU) - second operation information |
| 10 | compression - third operation information |
| 11 | security - fourth operation information |

Referring to Table 1, the functional block 30 may perform an operation according to first operation information, e.g., ECC, an operation according to second operation information, e.g., an ALU, an operation according to third operation information, e.g., compression, and an operation according to fourth operation information, e.g., security.

In this case, the functional block 30 may receive configuration information, select one of the first to fourth operation information, and perform the operation corresponding to the selected operation information. Although not shown, the functional block 30 may include a plurality of storage devices, and the operations corresponding to the first to fourth operation information may be performed using the plurality of storage devices.

For example, if configuration information contained in an input signal is '00', data stored in a first 6-bit LUT F0 may be accessed from among four 6-bit LUTs F0, F1, F2, and F3. Thus, the functional block 30 may perform the operation corresponding to the first operation information, e.g., the ECC. This operation may be performed based on a first part of the plurality of storage devices.

If the configuration information contained in the input signal is '01', data stored in the second 6-bit LUT F1 may be accessed from among the four 6-bit LUTs F0, F1, F2, and F3. Thus, the functional block 30 may perform the operation corresponding to the second operation information, e.g., the ALU. This operation may be performed based on a second part of the plurality of storage devices.

If the configuration information contained in the input signal is '10', data stored in the third 6-bit LUT F2 may be accessed from among the four 6-bit LUTs F0, F1, F2, and F3. Thus, the functional block 30 may perform the operation corresponding to the third operation information, e.g., compression. This operation may be performed based on a third part of the plurality of storage devices.

If the configuration information contained in the input signal is '11', data stored in the fourth 6-bit LUT F3 may be accessed from among four 6-bit LUTs F0, F1, F2, and F3. Thus, the functional block 30 may perform the operation corresponding to the fourth operation information, e.g., security. This operation may be performed based on a fourth part of the plurality of storage devices.

According to example embodiments, the functional block 30 may receive a first input signal containing configuration information and external information, and may generate an output signal according to an operation selected from among a plurality of operations. Even if a general functional block and a general logic device are reconfigurable, the general functional block should be individually reconfigured to perform various operations, and such a reconfiguration needs a large amount of time. However, according to example embodiments, a functional block 30 and a logic device including the functional block 30 according to example embodiments may be set to perform various operations according to configuration information without having to be additionally reconfigured. Thus, the functional block 30 according to example embodiments may perform various operations within a shorter time compared to the general functional block.

One such operation of the functional block 30 may be illustrated as in the block diagram of the functional block 30a in FIG. 4. First, data stored in four 6-bit LUTs F0, F1, F2, and F3 are accessed based on external information contained in an input signal, and only data selected from among the accessed data stored in the four 6-bit LUTs F0 to F3 by a multiplexer that receives configuration information is output as an output signal. It will be apparent to those of ordinary skill in the art that although FIGS. 3 and 4 illustrate operations of a functional block differently, e.g., in a different sequence, a result of performing the operations is the same.

Figure 5:
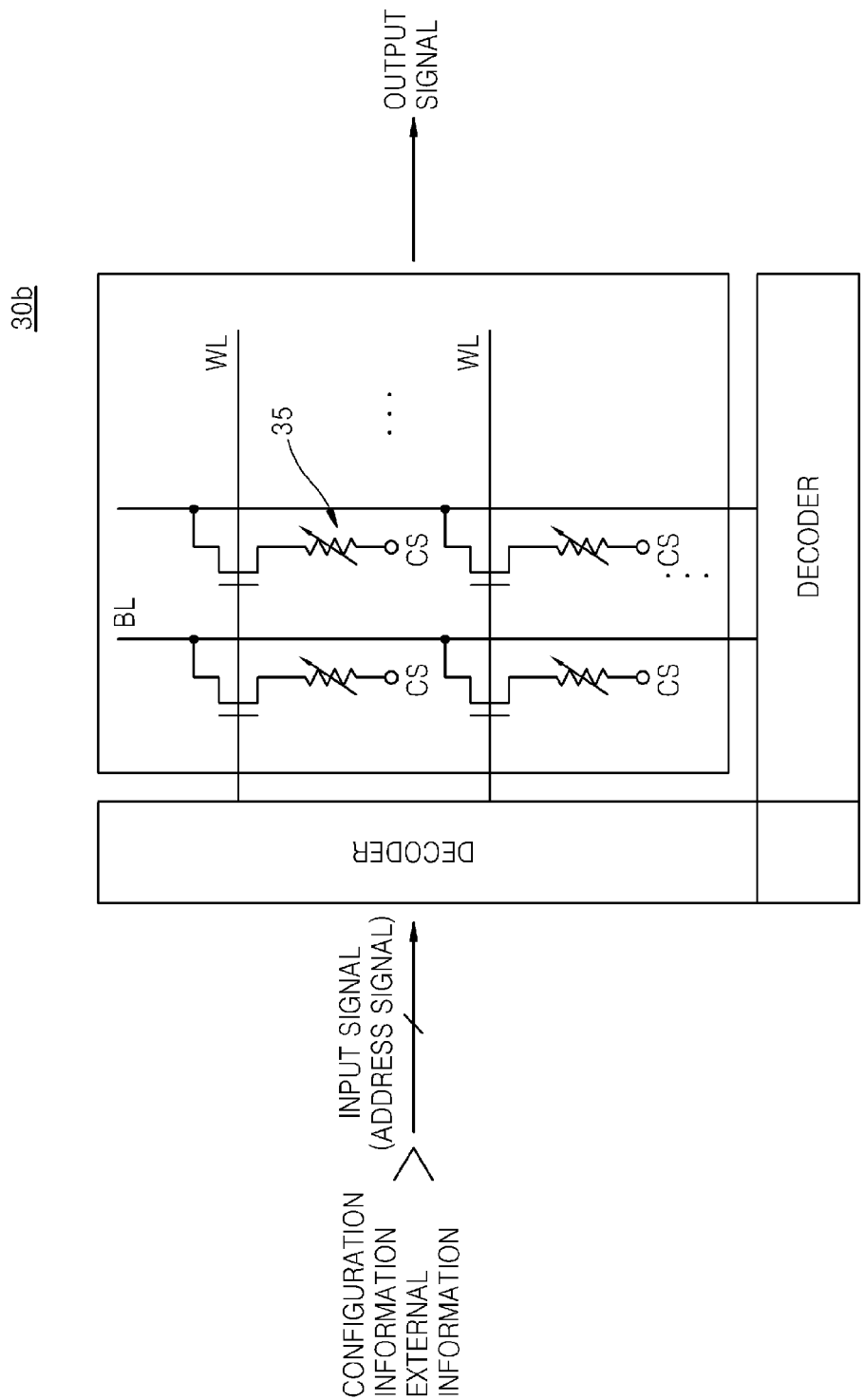
FIG. 5 is a schematic block diagram of a functional block included in a logic device, according to example embodiments.

FIG. 5 is a schematic block diagram of a functional block 30b included in a logic device, according to example embodiments. As described with reference to FIG. 3, the functional block 30b may include a plurality of storage devices (not shown). The plurality of storage devices may include, e.g., reconfigurable non-volatile memory devices.

FIG. 5 illustrates the functional block 30b including non-volatile memory devices 35 arranged in an array, according to example embodiments. The non-volatile memory devices 35 store data based on operation information (see Table 1). The stored data may be accessed according to an input signal and be output as an output signal. In this case, the input signal may be used as a type of address signal.

The input signal may include not only an external signal for performing an operation but also configuration information for selecting an operation from among a plurality of operations. For example, if the input signal is an 8-bit signal, first two bits of the 8-bit signal may include configuration information and the other six bits of the 8-bit input signal may include external information. In this case, the total number of non-volatile memory devices may be 256 and may be accessed according to the 8-bit input signal.

Referring to FIG. 3, the non-volatile memory devices may be divided into four parts, each of which may include 64 memory devices, e.g., a 6-bit LUT. For example, from among the four parts, a first part may be non-volatile memory devices for performing an operation related to an ECC, a second part may be non-volatile memory devices for performing an operation related to an ALU, a third part may be non-volatile memory devices for performing an operation related to compression, and a fourth part may be non-volatile memory devices for performing an operation related to security.

In this case, some of the first to fourth parts may be selected based on 2-bit configuration information, and data stored in the selected part may be output as an output signal according to 6-bit external information. Such an operation may be performed using a decoder that receives an input signal containing configuration information and external information and accesses data stored in a non-volatile memory device. As shown in FIG. 5, the decoder may be connected to rows of nonvolatile memory devices 35 through wordlines WL and the decoder may be connected to columns of nonvolatile memory devices 35 through bitlines. Reference characters CS indicate a common source CS. The common source CS may be a ground to which a reference voltage is provided.

While example embodiments have been described with respect to the functional block 30b including a plurality of non-volatile memory devices, but example embodiments are not limited thereto. According to example embodiments, various operations may be performed by storing operations corresponding to a plurality of pieces of operation information in the functional block 30b, receiving configuration information, and accessing data according to the configuration information from among the stored operation information. It will be apparent to those of ordinary skill in the art that the functional block 30b may include, for example, a plurality of static random access memories (SRAMs) instead of a plurality of non-volatile memory devices.

Figure 6:
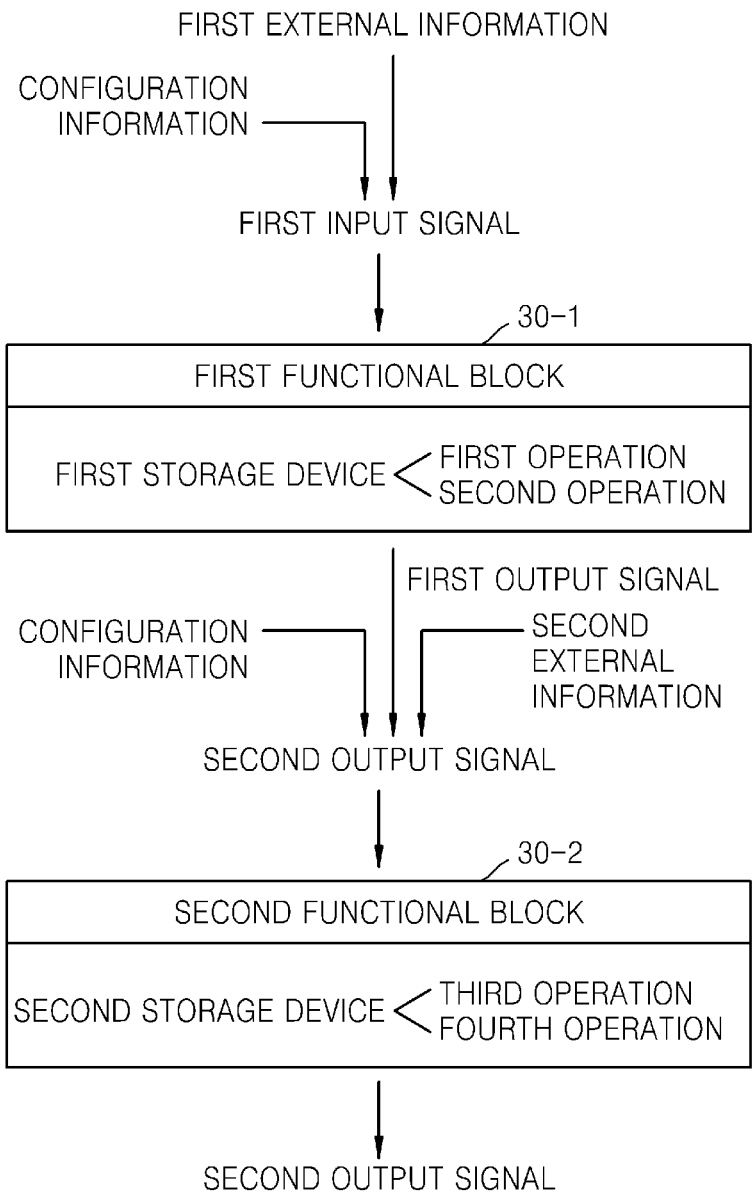
FIG. 6 is a schematic block diagram of a logic block included in a logic device, according to example embodiments.

FIG. 6 is a schematic block diagram of a logic block 50 included in a logic device, according to example embodiments. A description of FIG. 6, which is the same as that of FIG. 3, will not be provided again here.

Referring to FIG. 6, the logic block 50 in the logic device may include a first functional block 30-1 and a second functional block 30-2.

The first functional block 30-1 may perform a first operation according to first operation information and a second operation according to second operation information. The first or second operation information may be selected by receiving configuration information, and the first or second operation may be performed based on the selected operation information.

More specifically, the first functional block 30-1 receives a first input signal containing configuration information and first external information. Although not shown, the first input signal may further contain information regarding an output signal of another functional block (not shown). Whether the first input signal contains information regarding an output signal of another functional block (not shown) may be determined based on a connection between interconnection units.

The first functional block 30-1 may include a plurality of first storage devices 35 as in the functional block of FIG. 5. The plurality of first storage devices may be accessed according to the first input signal. If the configuration information is a 1-bit signal, the first functional block 30-1 may perform two operations, e.g., the first and second operations. In this case, the first operation may be performed using some of the plurality of first storage devices and the second operation may be performed using the other first storage devices. The first functional block 30-1 may output a first output signal as a result of performing the first or second operation.

The second functional block 30-2 may perform a third operation according to the first operation information and a fourth operation according to the second operation information. The first or second operation information may be selected by receiving configuration information, and the third or fourth operation may be performed based on the selected operation information, e.g., first operation information or second operation information.

More specifically, the second functional block 30-2 receives a second input signal containing configuration information and second external information. Optionally, the second input signal may further contain information regarding the first output signal. Whether the second input signal contains the information regarding the first output signal may be determined based on a connection between interconnection units. This will be described in detail with reference to FIG. 8 later.

The second functional block 30-2 may include a plurality of second storage devices (not shown) as in the functional block of FIG. 5. The plurality of second storage devices may be accessed according to the second input signal. If the configuration information is a 1-bit signal, the second functional block 30-2 may perform two operations, e.g., the third and fourth operations. In this case, the third operation may be performed using some of the plurality of second storage devices and the fourth operation may be performed using the other second storage devices. The second functional block 30-2 may output a second output signal as a result of performing the third or fourth operation.

Figure 7:
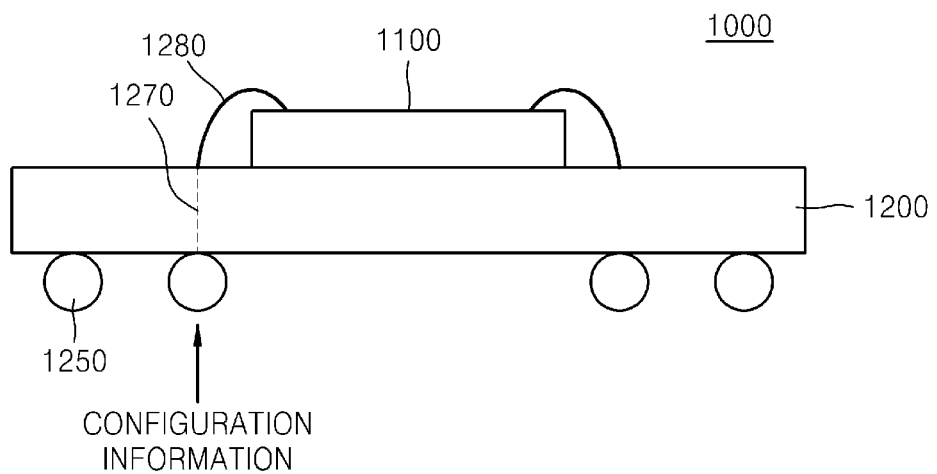
FIG. 7 is a schematic cross-sectional view of a semiconductor package according to example embodiments.

FIG. 7 is a schematic cross-sectional view of a semiconductor package 1000 according to example embodiments. The semiconductor package 1000 may be a modified example of the logic device of FIG. 6, and thus, a description of the features of FIG. 7 that are the same as that of FIG. 6 will not be provided again here.

Referring to FIG. 7, the semiconductor package 1000 may include a semiconductor chip 1100 and a printed circuit board (PCB) 1200.

In the semiconductor chip 1100, a logic device (not shown) may be included. For example, the logic device may be as described above with reference to FIGS. 2 to 6.

The semiconductor chip 1100 may be mounted on the PCB 1200. The PCB 1200 may include external terminals 1250, such as solder balls. In particular, the external terminals 1250 may receive configuration information. The configuration information received via the external terminals 1250 may be transmitted to the logic device in the semiconductor chip 1100 via an internal interconnection unit 1270 and a wire 1280.

If the semiconductor chip 1100 or the semiconductor package 1000 includes a general logic unit, the external terminals 1250 that receives configuration information are not mounted thereon. A logic device, a semiconductor chip 1100, and a semiconductor package 1000 according to example embodiments may receive configuration information via the external terminals 1250 and may perform various operations based on the configuration information. Thus, it will be apparent to those of ordinary skill in the art that if the external terminals 1250 that receive configuration information for setting various operations are included in a product's specifications, it may be considered a semiconductor package according example embodiments.

Figure 8:
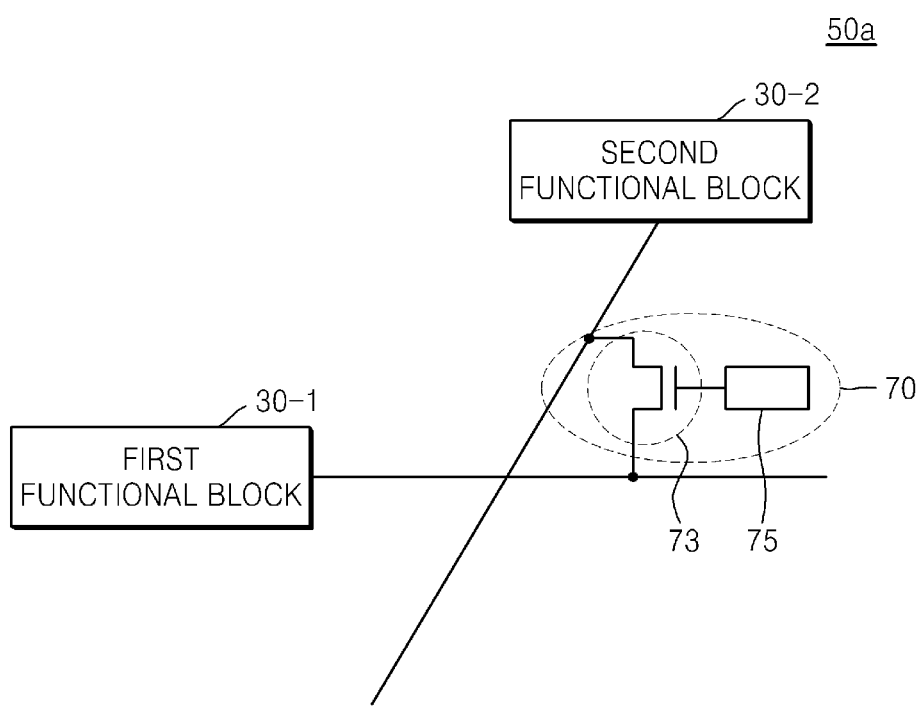
FIG. 8 is a schematic block diagram of a logic block included in a logic device, according to example embodiments.

FIG. 8 is a schematic block diagram of a logic block 50a included in a logic device, according to example embodiments. The description of FIG. 8 will only focus on the differences between FIG. 8 and FIG. 6.

Referring to FIG. 8, the logic block 50a may further include an interconnection unit 70 for connecting a first functional block 30-1 and a second functional block 30-2.

The interconnection unit 70 may receive configuration information and select one from among a plurality of pieces of interconnection information. The interconnection unit 70 may connect first functional block 30-1 and the second functional block 30-2, based on the selected interconnection information. Here, interconnection information may be determined by an operation of the logic device.

The interconnection unit 70 may include a switch device 73 and a configuration unit 75 so as to connect the first functional block 30-1 and the second functional block 30-2 based on the selected interconnection information.

The switch device 73 connects the first functional block 30-1 and the second functional block 30-2 according to a control signal, and may be embodied as, for example, an N-type transistor. If the switch device 73 is the N-type transistor, a gate of the N-type transistor may function as a control terminal for determining whether the first functional block 30-1 and the second functional block 30-2 are to be connected to each other.

The configuration unit 75 may store the interconnection information and may generate the control signal based on the interconnection information. The structure of the configuration unit 75 will be described in detail with reference to FIG. 9.

Figure 9:
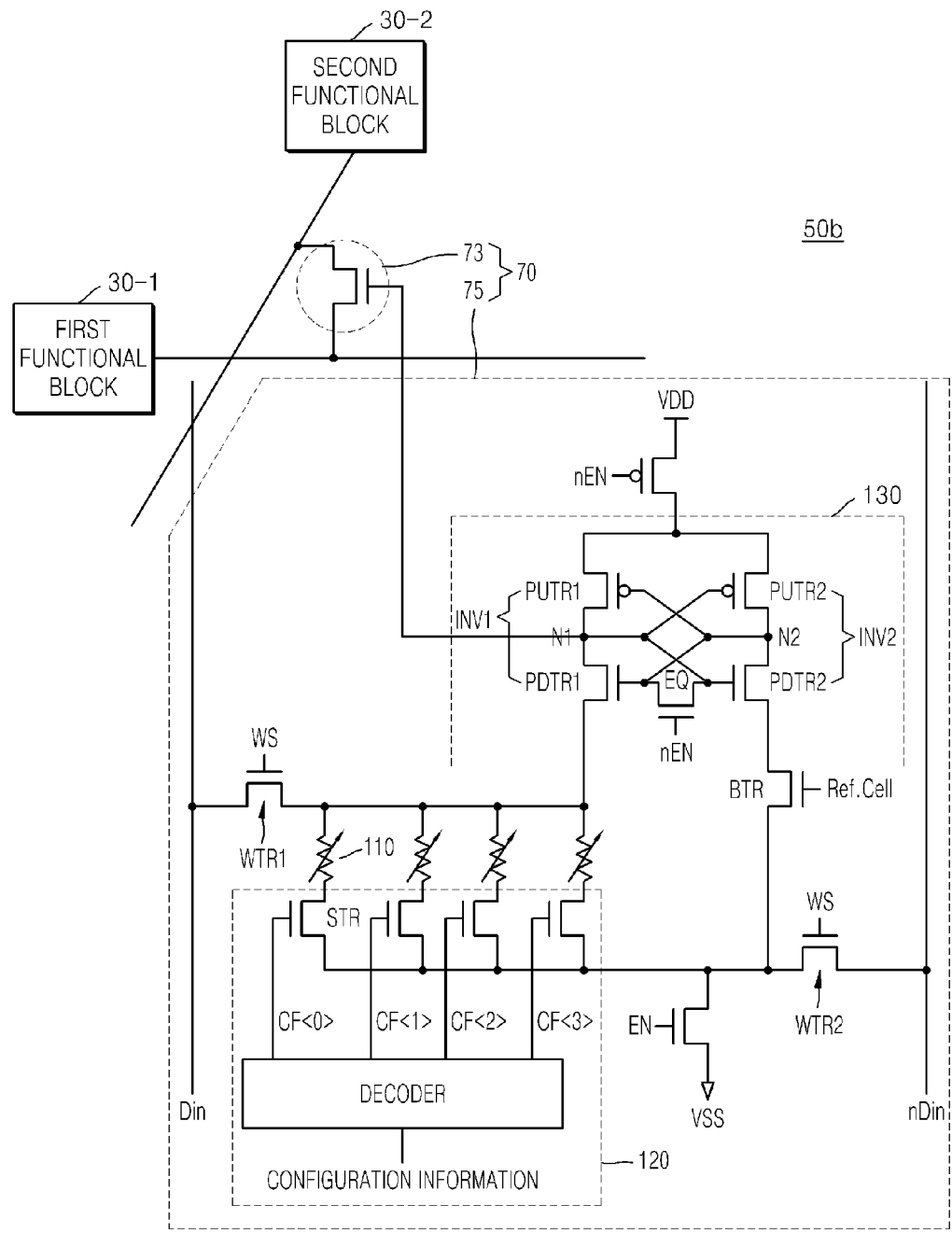
FIG. 9 is a circuit diagram of a modified example of the logic block illustrated in FIG. 8, in which an interconnection block is specifically illustrated.

FIG. 9 is a circuit diagram of a logic block 50b in which a non-limiting example of an interconnection block 70 is illustrated. Referring to FIG. 9, a configuration unit 75 may include a plurality of third storage devices 110, a selector 120, a latch 130, a first write transistor WTR1, a second write transistor WTR2, and a bias transistor BTR.

Each of the plurality of third storage devices 110 may store interconnection information and may include, for example, a non-volatile memory device. If the logic device performs, for example, four operations corresponding to an ECC, an ALU, compression, and security (see Table 1), the plurality of third storage devices 110 may include four non-volatile memory devices. During a read operation, the plurality of third storage devices 110 may be connected between a source of a first pull-down transistor PDTR1 and a ground voltage VSS terminal.

The selector 120 may be connected to the plurality third storage devices 110 and may select one from among the plurality of third storage devices 110. To this end, the selector 120 may include a plurality of selection transistors STR and a decoder. The plurality of selection transistors STR may be respectively connected to the plurality of third storage devices 110, and may respectively receive selection signals CF<0>, CF<1>, CF<2>, and CF<3> decoded by the decoder plurality third storage devices 110 so as to connect one of the plurality third storage devices 110 to the ground voltage VSS terminal.

In the read mode, one of the plurality of third storage devices 110 may be selected by the selector 120 based on configuration information, and interconnection information may be read by the selected third storage device 110. In a write mode, one of the plurality of third storage devices 110 may be selected by the selector 120 based on the configuration information, and the interconnection information may be written by the selected third storage device 110. Operations of the selector 120 in the read mode and the write mode will be described in detail with reference to FIGS. 10 to 13 later.

The latch 130 may read interconnection information from the plurality of third storage devices 110 and store the read interconnection information therein. The latch 130 may include a first inverter INV1 and a second inverter INV2.

The first inverter INV1 may include a first pull-up transistor PUTR1 connected to a power supply voltage VDD terminal, and a first pull-down transistor PDTR1 connected in series to the first pull-up transistor PUTR1. More specifically, the first pull-up transistor PUTR1 may be a P-type transistor having a source connected to the power supply voltage VDD terminal, a drain connected to a first node N1, and a gate connected to a second node N2. The first pull-down transistor PDTR1 may be an N-type transistor having a source connected to the plurality of third storage devices 110, a drain connected to the first node N1, and a gate connected to the second node N2. Here, a control terminal, e.g., a gate, of the switch device 73 may be connected to a node, e.g., the first node N1, between the first pull-up transistor PUTR1 and the first pull-down transistor PDTR1.

The second inverter INV2 may include a second pull-up transistor PUTR2 connected to the power supply voltage VDD terminal, and a second pull-down transistor PDTR2 connected in series to the second pull-up transistor PUTR2. More specifically, the second pull-up transistor PUTR2 may be a P-type transistor having a source connected to the power supply voltage VDD terminal, a drain connected to the second node N2, and a gate connected to the first node N1. The second pull-down transistor PDTR2 may be an N-type transistor having a source connected to the bias transistor BTR, a drain connected to the second node N2, and a gate connected to the first node N1.

The first inverter INV1 and the second inverter INV2 may be cross-linked to each other by connecting the gates of the first pull-up transistor PUTR1 and the first pull-down transistor PDTR1 to the second node N2 and connecting the gates of the second pull-up transistor PUTR2 and the second pull-down transistor PDTR2 to the first node N1, thereby manufacturing the latch 130.

Optionally, the latch 130 may further include an equalizer EQ. The equalizer EQ may connect the gate of the first pull-down transistor PDTR1 and the gate of the second pull-down transistor PDTR2, based on an enable bar signal nEN. More specifically, the equalizer EQ may be an N-type transistor having a source connected to the gate of the first pull-down transistor PDTR1, a drain connected to the gate of the second pull-down transistor PDTR2, and a gate via which the enable bar signal nEN is received.

The first write transistor WTR1 may be connected to one end of the third storage device 110, and the second write transistor WTR2 may be connected to another end of the third storage device 110. In the write mode, if a write signal WS is supplied to the first and second write transistors WTR1 and WTR2, the first and second write transistors WTR1 and WTR2 may be turned on to write interconnection information received via a data line Din and interconnection information received via a data line nDin to the third storage device 110.

The bias transistor BTR may provide a reference resistance value while interconnection information is read from one of the plurality of third storage devices 110. For example, if a resistance value stored in the third storage device 110 is 1 kΩ when the interconnection information denotes a disconnection state, e.g., '0', and is 1 MΩ when the interconnection information denotes a connection state, e.g., '1', then the bias transistor BTR may be set to have a resistance value of 50 kΩ. During the read mode, the bias transistor BTR may be connected to the source of the second pull-down transistor PDTR2 and the ground voltage VSS terminal. Although the bias transistor BTR, which is an active device, is illustrated in FIG. 9, a resistance device, which is a passive device, may be used to provide the reference resistance value.

Although FIG. 9 has been described with respect to the plurality of third storage devices 110 including a plurality of non-volatile memory devices, example embodiments are not limited thereto. According to example embodiments, various operations may be performed using the first and second functional blocks 30-1 and 30-2 by storing a plurality of pieces of interconnection information corresponding to a plurality of pieces of operation information in the plurality of third storage devices 110, receiving configuration information, and accessing the interconnection information according to the configuration information from among the stored operation information. It will be apparent to those of ordinary skill in the art that the plurality of third storage devices 110 may include, for example, a plurality of SRAMs instead of a plurality of non-volatile memory devices.

Figure 10:
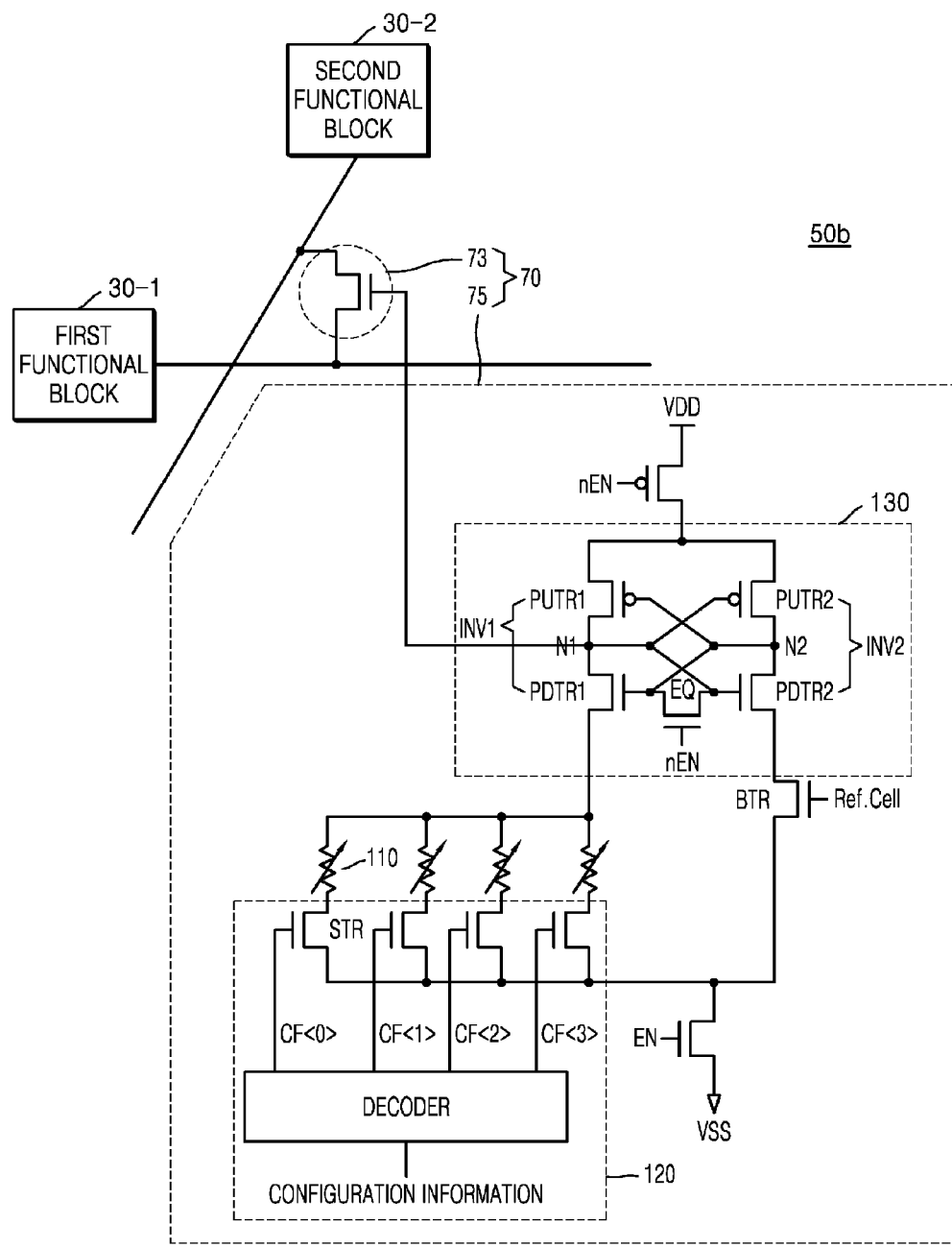
FIG. 10 is a circuit diagram illustrating a case where an interconnection unit of FIG. 9 is in a read mode, according to example embodiments.
Figure 11:
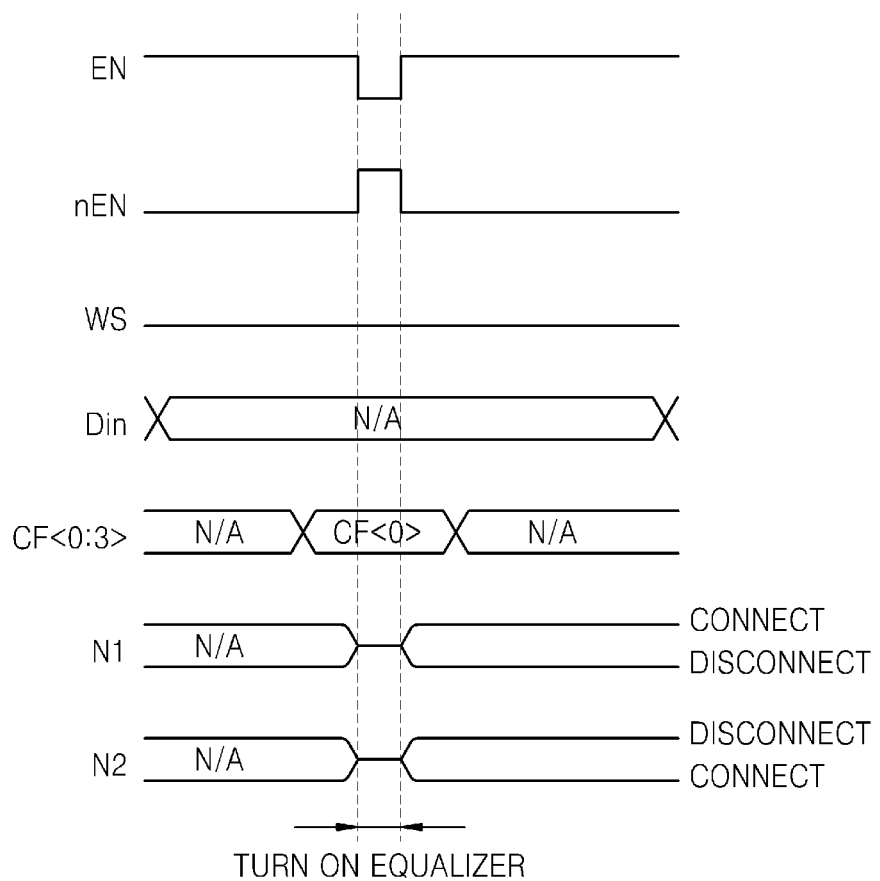
FIG. 11 is a timing diagram of signals used in the read mode, according to example embodiments.

FIG. 10 is a circuit diagram illustrating a case where the interconnection unit 70 of FIG. 9 is in a read mode, according to example embodiments. FIG. 11 is a timing diagram of signals used in the read mode, according to example embodiments.

Referring to FIGS. 10 and 11, in the read mode, an enable signal EN is deactivated to '0' and an enable bar signal nEN is activated to '1'. A write signal WS is deactivated to '0'.

If the enable bar signal nEN is activated to '1', the equalizer EQ may be turned on and the gate of the first pull-down transistor PDTR1 may be connected to the gate of the second pull-down transistor PDTR2. Thus, the gates of the first pull-down transistor PDTR1 and the second pull-down transistor PDTR2 are equal to each other, and both the first pull-down transistor PDTR1 and the second pull-down transistor PDTR2 are thus turned on.

The selection transistor STR may be turned on according to a selection signal, e.g., the selection signal CF<0>, which is decoded based on configuration information before the equalizer EQ is turned on. If the selection transistor STR is turned on, then a voltage corresponding to a resistance value of the third storage device 110 is applied to the source of the first pull-down transistor PDTR1. For example, when the third storage device 110 is in a high resistance state denoting a connection state, the third storage device 110 has a higher resistance value than that of the bias transistor BTR and a high voltage is applied to the source of the first pull-down transistor PDTR1. Since the resistance value of the bias transistor BTR is relatively low, a low voltage is applied to the source of the second pull-down transistor PDTR2.

Then, when the equalizer EQ is turned on, voltages of the first node N1 and the second node N2 become the same. Next, when the enable signal EN is activated to '1' and the enable bar signal nEN is deactivated to '0', the high voltage applied to the source of the first pull-down transistor PDTR1 is transferred to the first node N1, and the low voltage applied to the source of the second pull-down transistor PDTR2 is transferred to the second node N2. That is, since the resistance value of the third storage device 110 connected to the ground voltage VSS terminal is greater than that of the bias transistor BTR connected to the ground voltage VSS terminal, the second node N2 is connected to the ground voltage VSS terminal and the voltages of the second node N2 and the first node N1 thus respectively become '0' and '1'. Thus, a voltage of '1' is applied to the control terminal of the switch device connected to the first node N1, the switch device 73 is turned on, and the first functional block 30-1 and the second functional block 30-2 are connected to each other.

If the third storage device 110 is in a low resistance state denoting a disconnection state, the third storage device 110 has a lower resistance value than that of the bias transistor BTR and a low voltage is thus applied to the source of the first pull-down transistor PDTR1. Since the bias transistor BTR has a relatively high resistance value, a high voltage is applied to the source of the second pull-down transistor PDTR2.

Then, when the equalizer EQ is turned on, voltages of the first node N1 and the second node N2 become the same. Next, when the enable signal EN is activated to '1' and the enable bar signal nEN is deactivated to '0', the low voltage applied to the source of the first pull-down transistor PDTR1 is transferred to the first node N1 and the high voltage applied to the source of the second pull-down transistor PDTR2 is transferred to the second node N2. Thus, a voltage of '0' is applied to the control terminal of the switch device connected to the first node N1, the switch device 73 is turned off, and the first functional block 30-1 and the second functional block 30-2 are not connected to each other.

Figure 12:
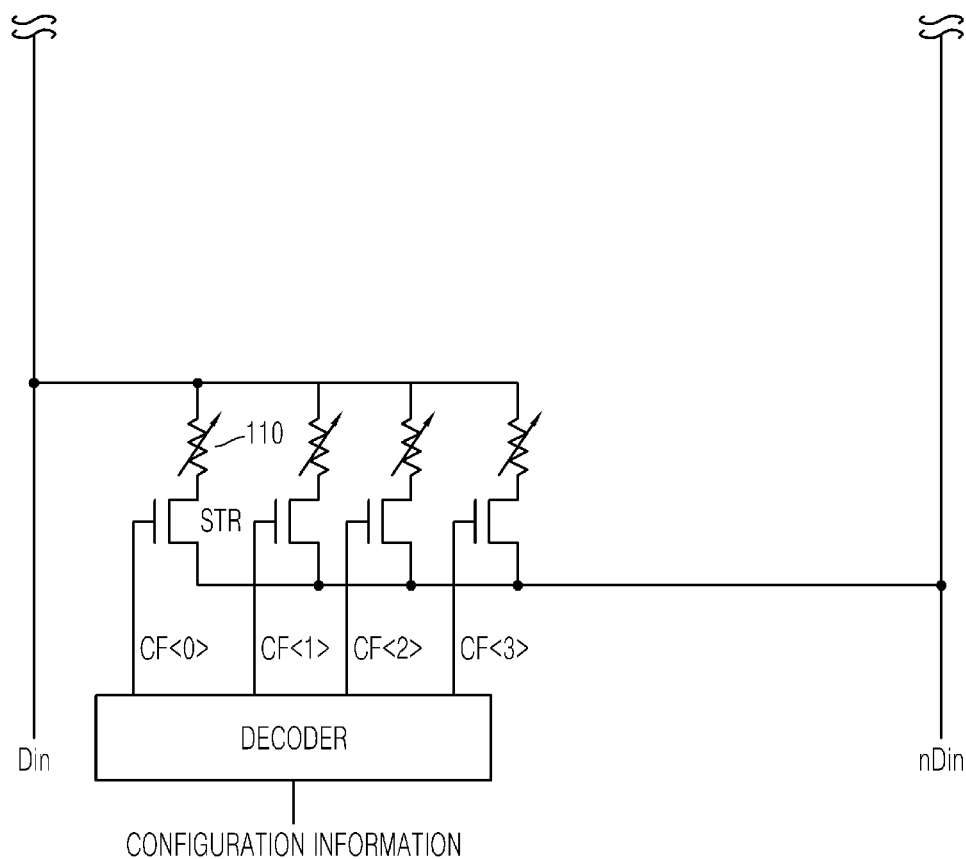
FIG. 12 is a circuit diagram illustrating a case where the interconnection unit of FIG. 9 is in a write mode, according to example embodiments.
Figure 13:
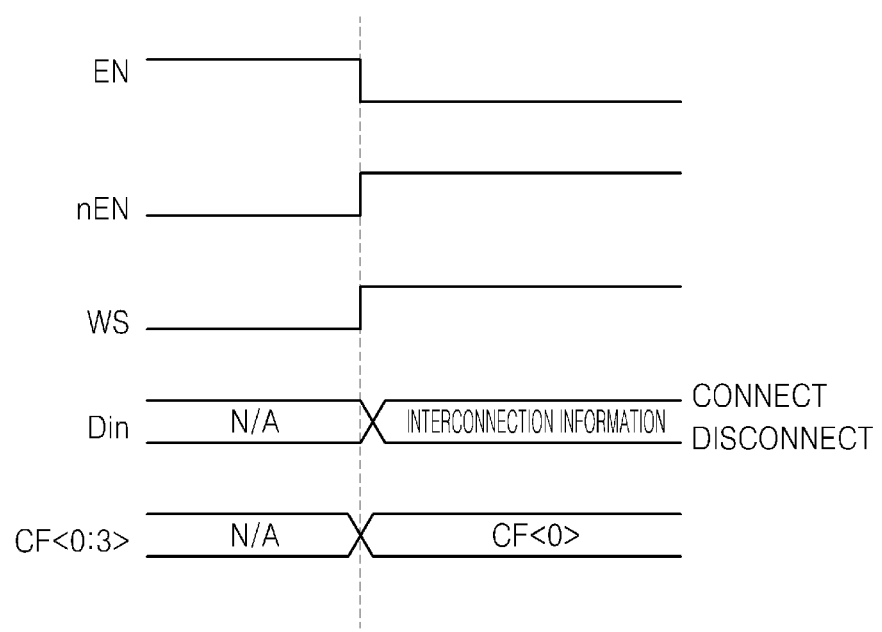
FIG. 13 is a timing diagram of signals used in the write mode, according to example embodiments.

FIG. 12 is a circuit diagram illustrating a case where the interconnection unit 70 of FIG. 9 is in a write mode, according to example embodiments. FIG. 13 is a timing diagram of signals used in the write mode, according to example embodiments.

Referring to FIGS. 12 and 13, in the write mode, an enable signal EN is deactivated to '0' and an enable bar signal nEN is activated to '1'. Also, a write signal WS is activated to '1'.

The selection transistor STR may be turned on according to a selection signal, e.g., a selection signal CF<0> decoded based on configuration information. If the selection transistor STR is turned on, one of the plurality of third storage devices 110 is selected and the selected third storage device 110 is ready to write interconnection information.

Then, interconnection information received via the data lines Din and nDin is written to the selected third storage device 110. If the first functional block 30-1 and the second functional block 30-2 need to be connected to each other while a logic device that performs, for example, four operations corresponding to an ECC, an ALU, compression, and security (see Table 1), performs the operation corresponding to the ECC, then interconnection information, e.g., a signal activated to '1', for allowing the third storage device 110 to be in a high resistance state may be written to the third storage device 110 selected according to the selection signal CF<0>.

Figure 14:
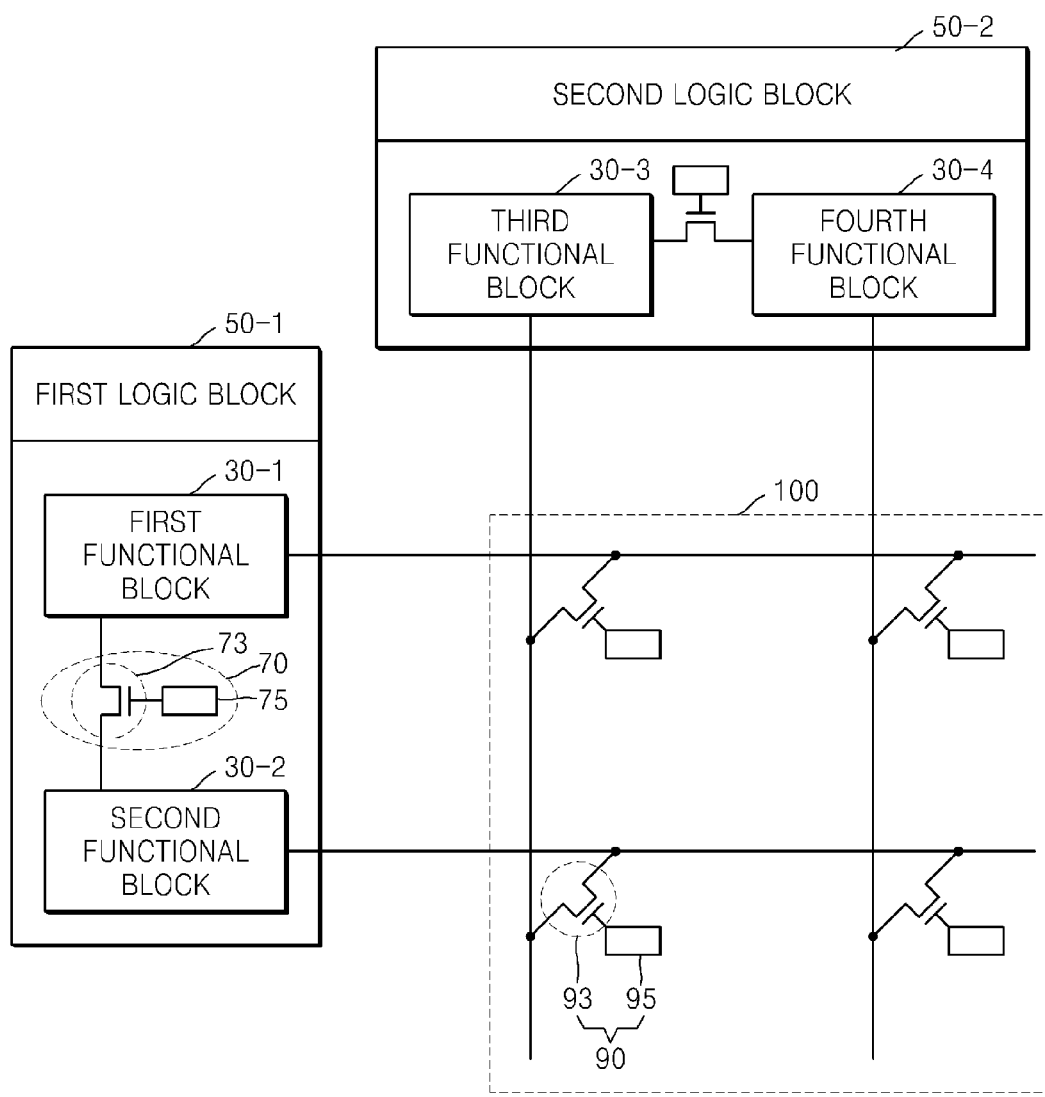
FIG. 14 is a schematic block diagram of a logic device according to example embodiments.

FIG. 14 is a schematic block diagram of a logic device according to example embodiments. Referring to FIG. 14, the logic device may include a plurality of logic blocks 50-1 and 50-2, an interconnection unit 70, and a connection block 100.

The logic block 50-1 may include a plurality of functional blocks 30-1 and 30-2, and the logic block 50-2 may include a plurality of functional blocks 30-3 and 30-4.

Each of the functional blocks 30-1 to 30-4 may perform a plurality of operations according to a plurality of pieces of operation information. Each of the functional blocks 30-1 to 30-4 may receive configuration information, select one of the plurality of pieces of operation information, and perform one of the plurality of operations based on the selected operation information, as described above with reference to FIGS. 2 to 7.

The interconnection unit 70 may connect either the functional blocks 30-1 and 30-2 or the functional blocks 30-3 and 30-4, based on a plurality of pieces of interconnection information. Specifically, as described above with reference to FIGS. 8 and 9, the interconnection unit 70 may receive configuration information, select one of the plurality of pieces of interconnection information based on the configuration information, and may connect either the functional blocks 30-1 and 30-2 or the functional blocks 30-3 and 30-4, based on the selected interconnection information. To this end, the interconnection unit 70 may include a first switch device 73 and a first configuration unit 75.

The connection block 100 may include a plurality of connection units 90, and the plurality of connection units 90 may connect the plurality of logic blocks 50-1 and 50-2 based on a plurality of pieces of pieces connection information. The plurality of connection units 90 may receive the plurality of pieces of configuration information, select one of the plurality of pieces of connection information, and connect the plurality of logic blocks 50-1 and 50-2 based on the selected connection information. The plurality of connection units 90 may have substantially the same circuit construction as the interconnection unit 70. For example, each of the plurality of connection units 90 may include a second switch device 93 and a second configuration unit 95.

The interconnection unit 70 may connect either the functional blocks 30-1 and 30-2 included in the first logic block 50-1 or the functional blocks 30-3 and 30-4 included in the second logic block 50-2, whereas the plurality of connection units 90 may connect the plurality of logic blocks 50-1 and 50-2.

Figure 15:
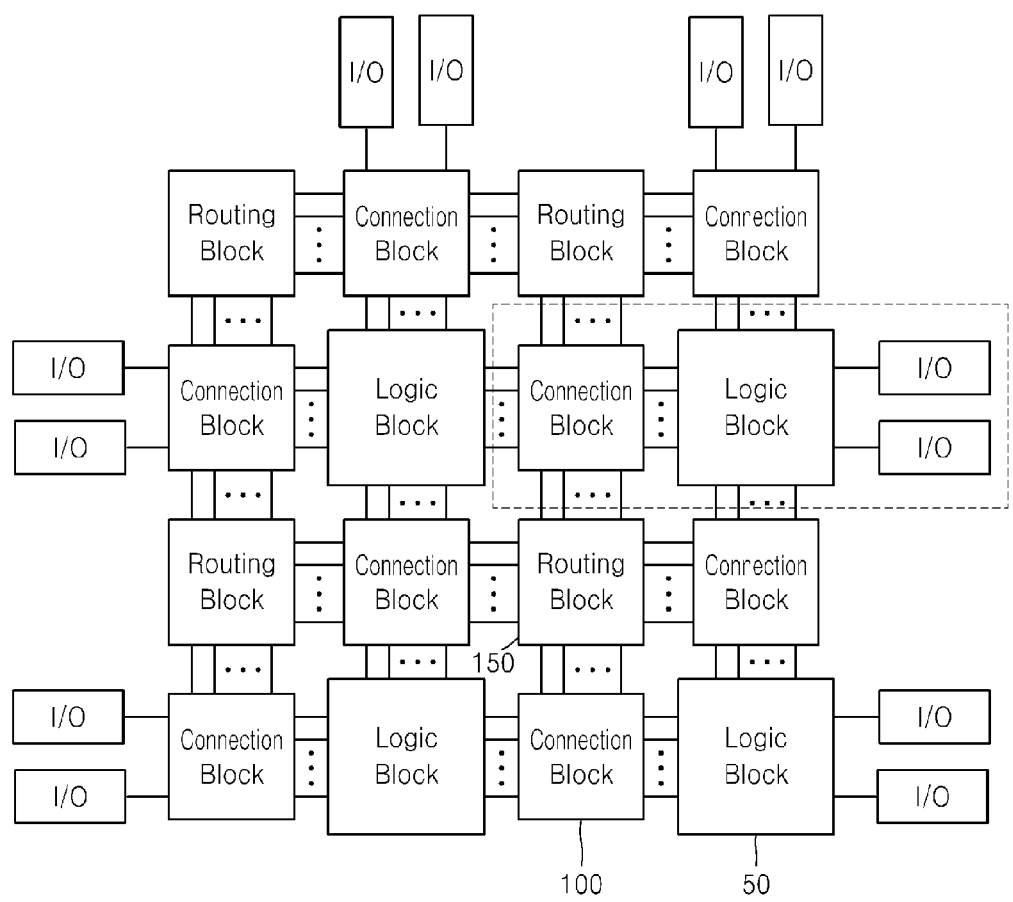
FIG. 15 is a schematic block diagram of a logic device according to example embodiments.

FIG. 15 is a schematic block diagram of a logic device according to example embodiments. The logic device of FIG. 15 may be a modified example of the logic device of FIG. 14, and thus, a description of the embodiment of FIG. 15 that is the same as that of the embodiment of FIG. 14 will not be provided again here.

Referring to FIG. 15, the logic device may include a plurality of logic blocks 50, a plurality of connection blocks 100, a plurality of routing blocks 150, and a plurality of input/output (I/O) terminals.

The plurality of logic blocks 50 may be arranged in a matrix. The plurality of connection blocks 100 may be disposed between adjacent logic blocks 50 arranged in a matrix to connect the plurality of logic blocks 50. Each of the plurality of connection blocks 100 may include the plurality of connection units 90 of FIG. 14, and each of the plurality of connection units 90 may include the second switch device 73 and the second configuration unit 75 of FIG. 14, as described above with reference to FIG. 14.

Figure 18:
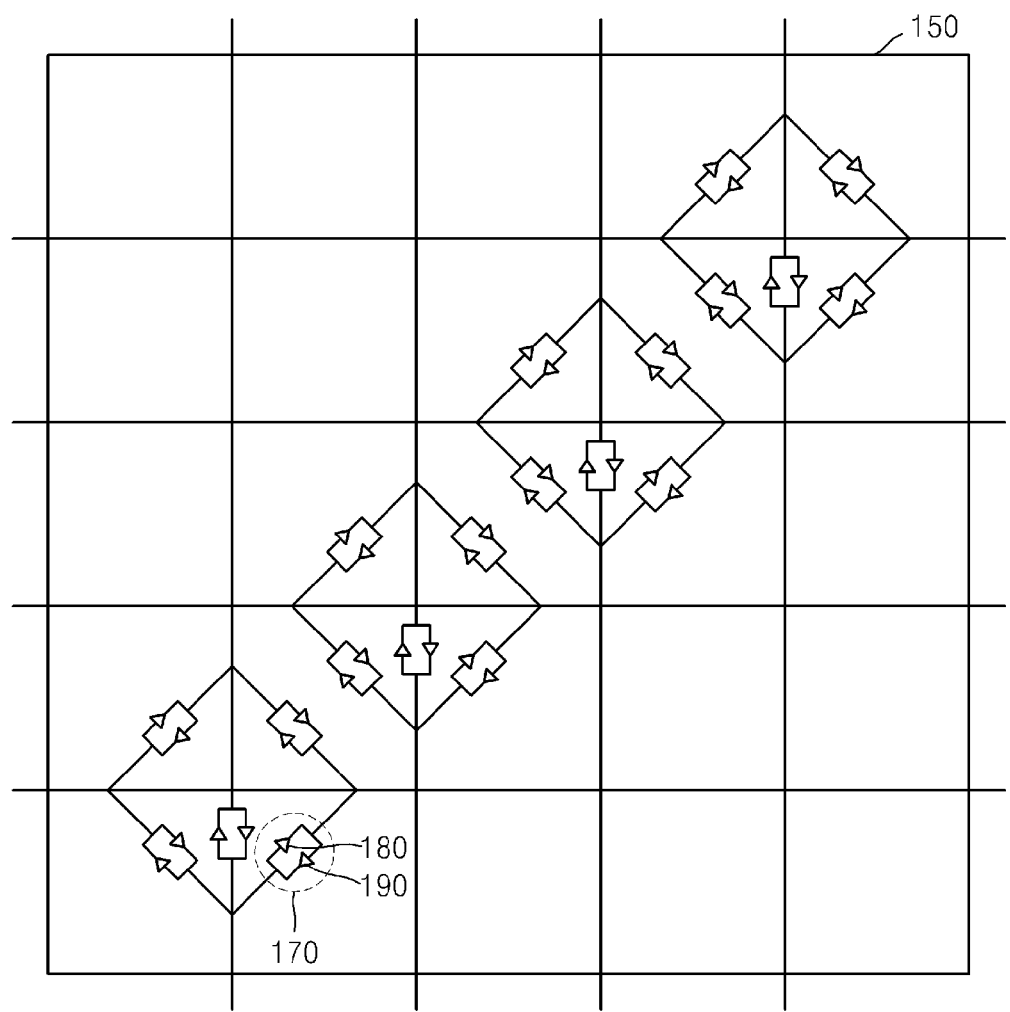
FIG. 18 is a block diagram specifically illustrating a routing block illustrated in FIG. 15, according to example embodiments.

Each of the plurality of routing blocks 150 may include a plurality of routing units 170 illustrated in FIG. 18. Each of the plurality of routing units 170 may receive a plurality of pieces of configuration information, select one of a plurality of pieces of routing information based on the plurality of pieces of configuration information, and connect the plurality of connection blocks 100 based on the selected routing information.

The plurality of I/O terminals may be connected to the plurality of connection blocks 100 or the plurality of logic blocks 50 to transmit the plurality of pieces of configuration information to either the plurality of connection units 90 in the plurality of connection blocks 100 and particularly, storage devices in connection units 90 or functional blocks (or interconnection units) in the logic blocks 50. Also, the I/O terminals may transmit output signals from the logic blocks 50 to the outside. The I/O terminals may be embodied as, for example, chip pads of semiconductor chips where a logic device is implemented therein.

Figure 16:
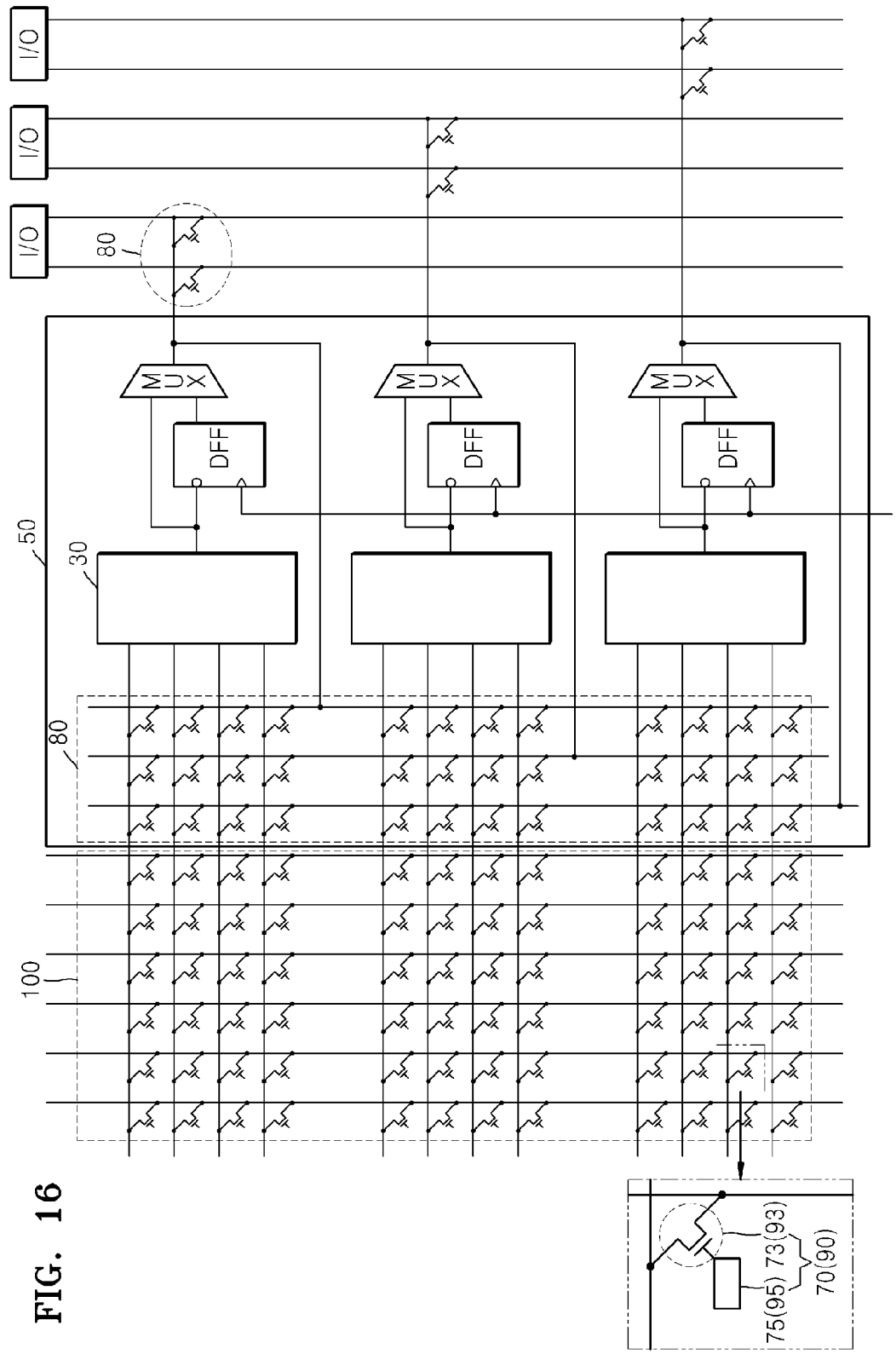
FIG. 16 is a block diagram specifically illustrating a connection block, a logic block, and an input/output (I/O) terminal included in the logic device of FIG. 15.

FIG. 16 is a block diagram specifically illustrating the connection block 100, the logic block 50, and the I/O terminal illustrated in FIG. 15. Referring to FIG. 16, the connection block 100 may include a plurality of interconnection units 70 or may include a plurality of connection units 90. In the logic block 50, each of functional blocks 30 may receive configuration information and external information via the interconnection units 70, and may be connected to the other functional blocks 30 included in the logic block 50. Also, each of the functional blocks 30 may be connected to functional blocks included in another logic block (not shown) via the connection units 90.

An output terminal of each of the functional blocks 30 may be connected to one of the I/O terminals. A D flip flop (DFF) and a multiplexer (MUX) may be connected to the output terminal of each of the functional blocks 30 and the corresponding I/O terminal. The DFF and the MUX may determine whether an output signal of the functional block 30 is to be output according to sequential logic or combinational logic. A unit 80 including at least one switch device and at least one configuration unit may further be included between the output terminal of each of the functional block 30 and the corresponding I/O terminal.

Figure 17:
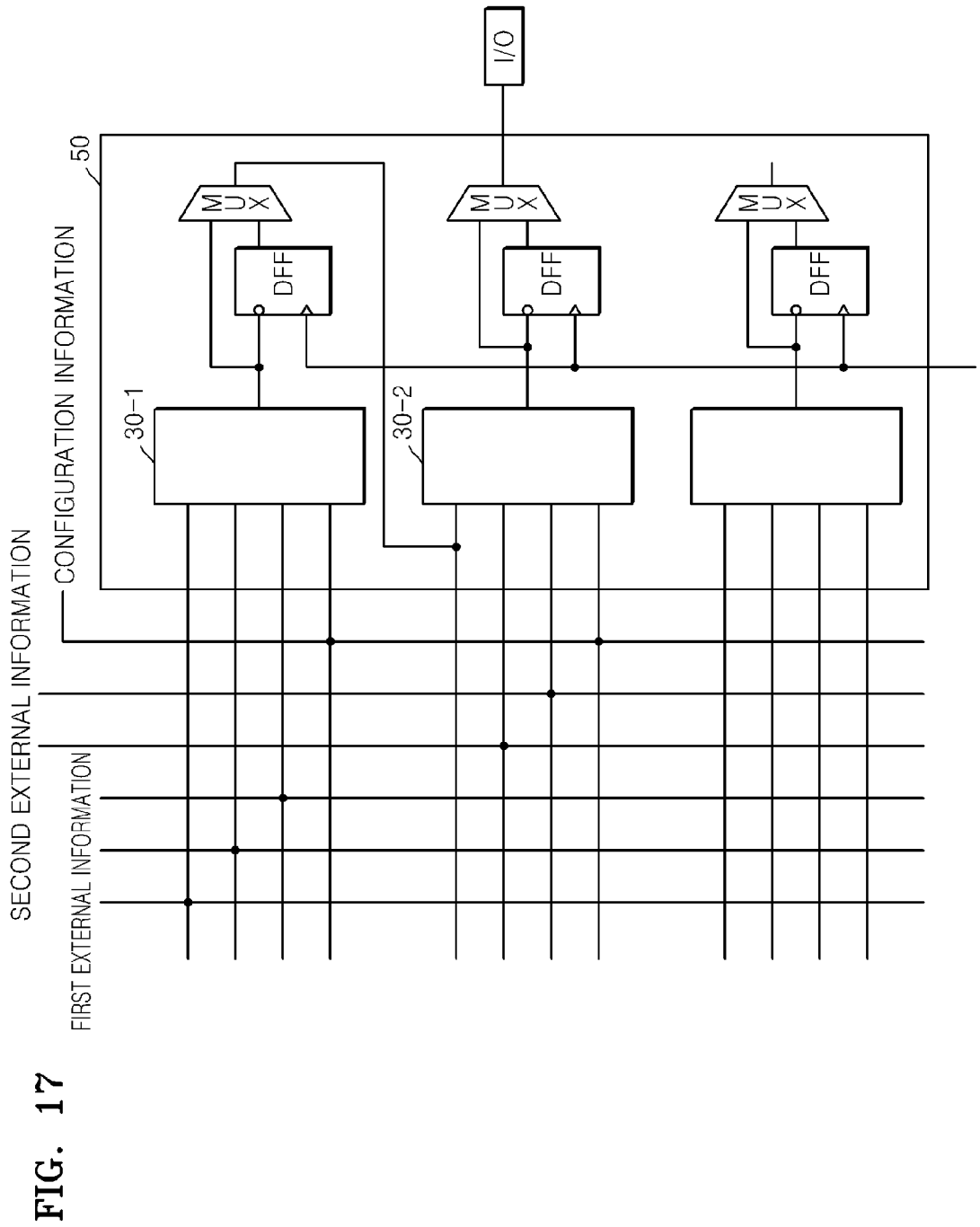
FIG. 17 is a schematic diagram illustrating a case where the logic device of FIG. 16 is configured to function as the logic device of FIG. 6.

FIG. 17 is a schematic diagram illustrating a case where the logic device of FIG. 16 is configured to function as the logic device of FIG. 6. Referring to FIG. 17, a first functional block 30-1 may receive a first input signal containing first external information and configuration information. The first functional block 30-1 may output a first output signal from the first input signal, and the first output signal may be transmitted as a second input signal to a second functional block 30-2. Thus, the second functional block 30-2 may receive a second input signal containing the first output signal, second external information, and the configuration information. An output terminal of the second functional block 30-2 may be connected to an I/O terminal. Thus, the second output signal may be output via the I/O terminal.

Figure 19:
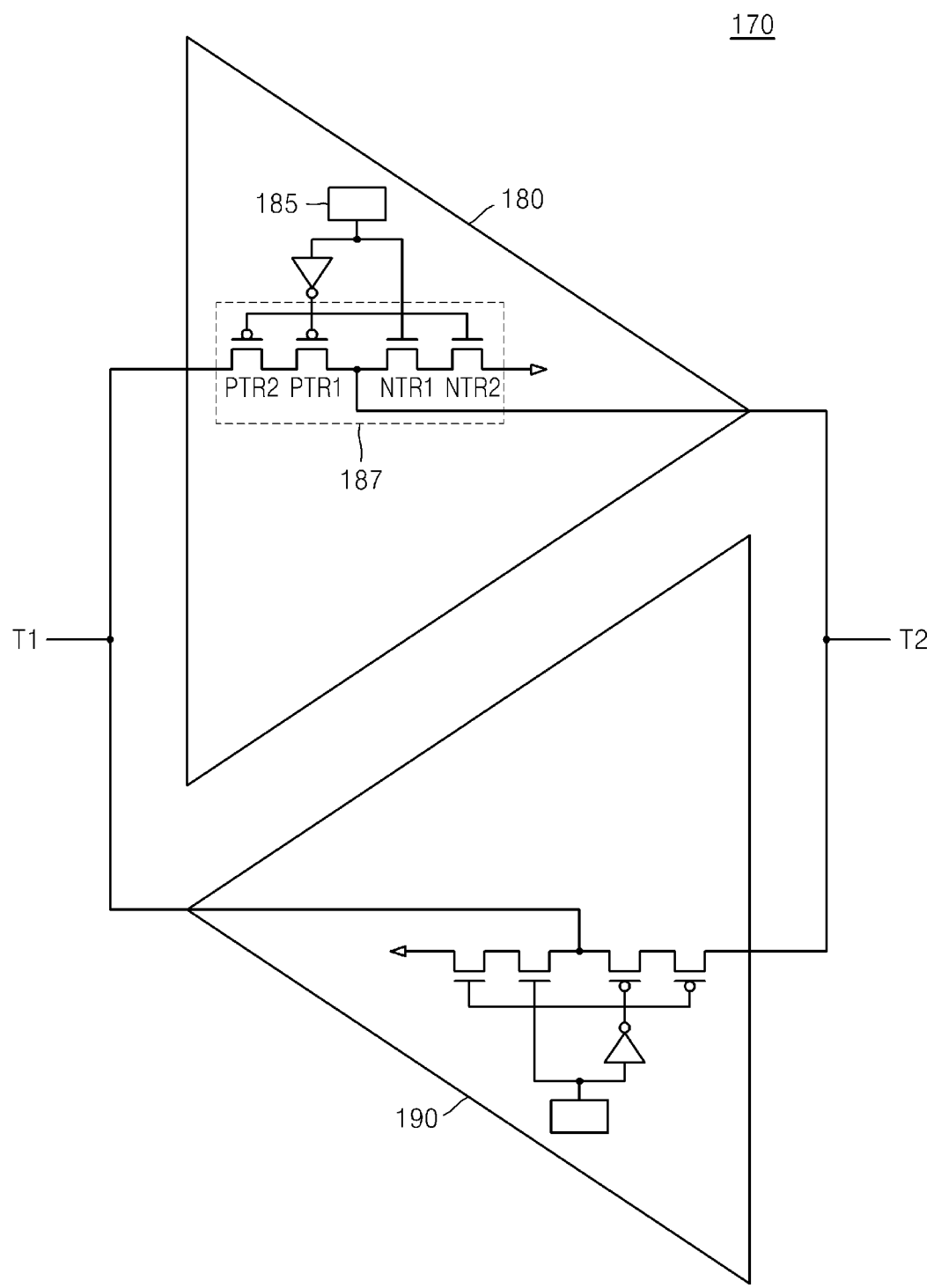
FIG. 19 is a circuit diagram specifically illustrating transmission units included in each of a plurality of routing units in the routing block illustrated in FIG. 15, according to example embodiments.

FIG. 18 is a block diagram specifically illustrating the routing block 150 illustrated in FIG. 15, according to example embodiments. FIG. 19 is a circuit diagram specifically illustrating first and second transmission units 180 and 190 included in each of a plurality of routing units 170 in the routing block 150 illustrated in FIG. 15, according to example embodiments.

Referring to FIGS. 18 and 19, each of the plurality of routing units 170 may include the first transmission unit 180 and the second transmission unit 190. The first transmission unit 180 may transmit a signal in a direction from a first terminal T1 to a second terminal T2, and the second transmission unit 190 may transmit a signal in a direction from the second terminal T2 to the first terminal T1. Whether a signal is to be transmitted and a direction in which the signal is to be transmitted may be determined according to configuration information. Thus, the connection blocks 100 of FIG. 15 may be appropriately connected via the plurality of routing units 170.

More specifically, the first transmission unit 180 may include a third configuration unit 185 and transistors 187. The third configuration unit 185 may receive configuration information and output a signal indicating whether a connection state or a disconnection state is required. For example, the third configuration unit 185 may output '1' when the connection state from the first terminal T1 to the second terminal T2 is required and may output '0' when the disconnection state is required, based on routing information. A circuit construction of the third configuration unit 185 may be the same as that of the configuration unit 75 of FIG. 9.

If routing information stored in the third configuration unit 185 denotes the connection state and the third configuration unit 185 outputs '1', a first N-type transistor NTR1 and a first P-type transistor PTR1 may be turned on. Thus, a signal may be transmitted in the direction from the first terminal T1 to the second terminal T2. If the routing information stored in the third configuration unit 185 denotes the disconnection state and the third configuration unit 185 outputs '0', the first N-type transistor NTR1 and the first P-type transistor PTR1 may be turned off. Thus, a signal may not be transmitted in the direction from the first terminal T1 to the second terminal T2.

Such a circuit construction and operation may also be applied to the second transmission unit 190. Thus, signal transmission of the routing unit 170 may be classified as follows:

TABLE 2

| Configuration unit of first transmission unit | Configuration unit of second transmission unit | Signal transmission of routing unit |
|---|---|---|
| connection (output '1') | connection (output '1') | not available |
| connection (output '1') | disconnection (output '0') | first terminal -> second terminal |
| disconnection (output '0') | connection (output '1') | second terminal -> first terminal |
| disconnection (output '0') | disconnection (output '0') | disconnection (transmit no signal) |

In a general reconfigurable logic device, functional blocks and connection blocks should be individually reconfigured to perform various operations, which results in a long time being taken to perform the operations. However, in a logic device according to example embodiments, information for performing various operations has been previously stored. That is, various operations may be set according to configuration information, and such reconfiguration is not needed. Thus, various operations may be performed within a short time.

Figure 20A:
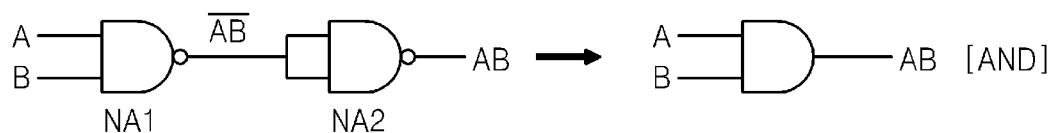
FIGS. 20A and 20B are diagrams illustrating non-limiting examples of connections between functional blocks in logic blocks according to example embodiments.
Figure 20B:
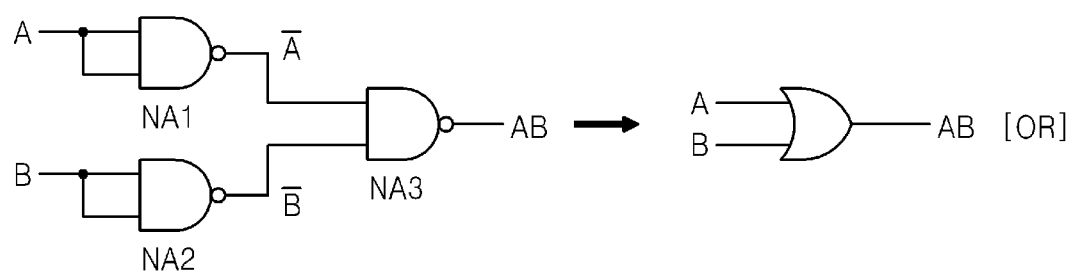

FIGS. 20A and 20B are diagrams illustrating non-limiting examples of connections between functional blocks in logic blocks according to example embodiments.

Referring to FIG. 20A, a logic block according to example embodiments may be configured to function as an AND gate by connecting a first functional block NA1 to a second function block NA2. For example, an interconnection unit (not shown in FIG. 20A) may be configured to connect the first NA1 and second NA2 functional blocks. The first NA1 and second NA2 functional blocks may be non-volatile memory devices, but example embodiments are not limited thereto. The first functional block 30-1 and the second functional block 30-2 described above with reference to FIG. 5 may be used as the first functional block NA1 and the second functional block NA2, respectively.

Referring to FIG. 20B, a logic block according to example embodiments may be configured to function as an OR gate when the first functional block NA1 and the second functional block NA2 are not connected to each other. An interconnection unit (not shown in FIG. 20B) may be configured to not connect the first NA1 and second NA2 functional blocks.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

What is claimed is:

1. A logic device comprising:
a first functional block;
a second functional block; and
an interconnection unit configured to connect the first functional block and the second functional block based on selected interconnection information from a plurality of pieces of interconnection information, the interconnection unit including a configuration unit configured to select the interconnection information from the plurality of pieces of interconnection information, the configuration unit including a selector and a plurality of internal storage devices, wherein the selector is configured to read the plurality of pieces of interconnection information from one of the plurality of internal storage devices selected based on configuration information, the first functional block is configured to, perform a first operation according to first operation information and to perform a second operation according to second operation information, receive configuration information and select one of the first operation information and the second operation information based on the configuration information, and perform one of the first and the second operation based on the selected one of the first and second operation information, and the second functional block is configured to, perform a third operation according to the first operation information and to perform a fourth operation according to the second operation information, receive the configuration information and select one of the first operation information and the second operation information based on the configuration information, and perform the one of the third and fourth operation based on the selected one of the first and second operation information.

2. The logic device of claim 1, wherein the first functional block is configured to receive a first input signal containing the configuration information, and the first functional block is configured to generate a first output signal according to the one of the first operation and the second operation.

3. The logic device of claim 1, wherein the first functional block includes a plurality of first storage devices, the first functional block is configured to perform the first operation using a first part of the plurality of first storage devices, and the first functional block is configured to perform the second operation using a second part of the plurality of first storage devices.

4. The logic device of claim 3, wherein the second functional block is configured to receive a second input signal containing the configuration information, the second functional block is configured to generate a second output signal according to the one of the third operation and the fourth operation, the second functional block includes a plurality of second storage devices, the second functional block is configured to perform the third operation using a first part of the plurality of second storage devices, and the second functional block is configured to perform the fourth operation using a second part of the plurality of second storage devices.

5. The logic device of claim 3, wherein each of the plurality of first storage devices include a plurality of reconfigurable non-volatile memory devices.

6. The logic device of claim 5, wherein the plurality of reconfigurable non-volatile memory devices are arranged in an array.

7. The logic device of claim 1, wherein the interconnection unit is configured to, receive the configuration information, select one piece of interconnection information from among the plurality of pieces of interconnection information, and connect the first functional block and the second functional block based on the selected piece of interconnection information.

8. The logic device of claim 7, wherein the interconnection unit comprises:

a switch device configured to connect the first functional block and the second functional block according to a control signal; and wherein the configuration unit is configured to generate the control signal.

9. The logic device of claim 8, wherein the internal storage devices are a plurality of third storage devices which are a plurality of non-volatile memory devices.

10. The logic device of claim 8, wherein the the selector is connected to the plurality of third storage devices and the selector is configured to select one of the plurality of third storage devices based on the configuration information so as to read the plurality of pieces of interconnection information.

11. A semiconductor package comprising:

a semiconductor chip comprising the logic device of claim 1; and a printed circuit board (PCB) on which the semiconductor chip is mounted.

12. The semiconductor package of claim 11, wherein the PCB includes an external terminal configured to receive the configuration information.

13. The semiconductor package of claim 11, wherein the logic device is one of a field programmable gate array (FPGA), a programmable array logic (PAL), a programmable logic array (PLA), and a generic array logic (GAL).

14. A logic device comprising:

a first functional block;

a second functional block; and an interconnection unit configured to connect the first functional block and the second functional block based on selected interconnection information from a plurality of pieces of interconnection information, the interconnection unit including a configuration unit configured to select the interconnection information from the plurality of pieces of interconnection information, the configuration unit including a latch and a plurality of internal storage devices, wherein the latch is configured to read the plurality of pieces of interconnection information from the plurality of internal storage devices and to store the read interconnection information of the plurality of pieces of interconnection information, the first functional block is configured to, perform a first operation according to first operation information and to perform a second operation according to second operation information;

receive configuration information and select one of the first operation information and the second operation information based on the configuration information; and perform one of the first and the second operation based on the selected one of the first and second operation information, and the second functional block is configured to, perform a third operation according to the first operation information and to perform a fourth operation according to the second operation information;

receive the configuration information and select one of the first operation information and the second operation information based on the configuration information; and perform the one of the third and fourth operation based on the selected one of the first and second operation information.

15. The logic device of claim 14, wherein the latch comprises:
a first inverter including,
a first pull-up transistor connected to a power supply voltage terminal, and
a first pull-down transistor connected in series to the first pull-up transistor;
a second inverter including,
a second pull-up transistor connected to the power supply voltage terminal, and
a second pull-down transistor connected in series to the second pull-up transistor, wherein
the second inverter and the first inverter are cross-linked to each other; and
an equalizer configured to connect a gate of the first pull-down transistor and a gate of the second pull-down transistor, based on an enable bar signal.

16. The logic device of claim 15, wherein a control terminal of the switch device is connected to a node between the first pull-up transistor and the first pull-down transistor.

17. The logic device of claim 15, wherein the plurality of third storage devices are connected between a source of the first pull-down transistor and a ground voltage terminal.

18. The logic device of claim 15, wherein the configuration unit further includes a bias transistor connected between a source of the second pull-down transistor and the ground voltage terminal.

19. A logic device comprising:
a plurality of logic blocks, each of the logic blocks including a plurality of functional blocks and an interconnection unit, wherein
each of the functional blocks is configured to,
perform a plurality of operations according to a plurality of pieces of operation information,
receive configuration information,
select a piece of operation information from among the plurality of pieces of operation information based on the configuration information, and
perform at least one of the plurality of operations based on the selected operation information,
the interconnection unit is configured to connect the plurality of functional blocks based on selected interconnection information from a plurality of pieces of interconnection information, the interconnection unit a first switch device and a first configuration unit, the first configuration unit configured to select the interconnection information from the plurality of pieces of interconnection information, the first configuration unit including,
a plurality of storage devices configured to store the plurality of pieces of interconnection information, and
a selector configured to read the plurality of pieces of configuration information from one of a plurality of storage devices selected based on the configuration information.

20. The logic device of claim 19, further comprising:
a connection block including a plurality of connection units configured to connect the plurality of logic blocks, based on a plurality of pieces of connection information, wherein each of the plurality of connection units is configured to,
receive the configuration information,
select one piece of connection information from among the plurality of pieces of connection information based on the configuration information, and
connect the plurality of logic blocks based on the selected connection information.

21. The logic device of claim 20, wherein each of the plurality of connection units includes a second switch device, a second configuration unit, and a selector,
the second configuration unit includes a plurality of storage devices configured to store the plurality of pieces of connection information,
the selector is connected to the plurality of storage devices, and
the selector is configured to select one of the plurality of storage devices based on the configuration information to read the plurality of pieces of connection information.

22. The logic device of claim 19, further comprising:
a plurality of connection blocks configured to connect the plurality of logic blocks; and
a routing block including a plurality of routing units configured to connect the plurality of connection blocks based on a plurality of pieces of routing information, wherein
each of the plurality of routing units is configured to,
receive the configuration information,
select a piece of routing information from among the plurality of pieces of routing information based on the configuration information, and
connect the plurality of connection blocks based on the selected routing information.

23. The logic device of claim 22, wherein each of the plurality of routing units includes:
a first transmission unit configured to transmit a signal in a direction from a first terminal to a second terminal, and
a second transmission unit configured to transmit a signal in a direction from the second terminal to the first terminal.

24. The logic device of claim 23, wherein
each of the first transmission units and the second transmission units of the plurality of routing unites include a third configuration unit,
the third configuration unit includes,
a plurality of storage devices configured to store the plurality of pieces of routing information, and
a selector connected to the plurality of storage devices,
wherein the selector is configured to select one of the plurality of storage devices based on the configuration information to read the plurality of pieces of routing information.

25. The logic device of claim 22, further comprising:
at least one routing block including a plurality of routing units configured to connect the plurality of connection blocks based on a plurality of pieces of routing information,
wherein each of the plurality of routing units is configured to,
receive the configuration information,
select a piece of routing information from among the plurality of pieces of routing information based on the configuration information, and
connect the plurality of connection blocks based on the selected routing information.

26. A semiconductor package comprising:
a semiconductor chip including a logic device, the logic device including an interconnection unit and a connection block; and
a printed circuit board (PCB) on which the semiconductor chip is mounted, wherein the connection block contains a connection unit configured to connect a plurality of logic blocks based on a plurality of pieces of connection information, the connection unit being configured to,
    receive configuration information,
    select a piece of connection information from among the plurality of pieces of connection information based on the configuration information, and
    connect the plurality of logic blocks based on the selected connection information; and
the interconnection unit is configured to connect functional blocks within each of the plurality of logic blocks based on selected interconnection information from a plurality of pieces of interconnection information, the interconnection unit including a configuration unit configured to select the interconnection information from the plurality of pieces of interconnection information, the configuration unit including a selector and a latch, wherein
the selector is configured to read the plurality of pieces of interconnection information from one of a plurality of internal storage devices selected based on configuration information, and
the latch is configured to store the plurality of pieces of interconnection information read from the selected internal storage device.

27. A logic device comprising:
at least one logic block that includes a first functional block, a second functional block adjacent to the first functional block and an interconnection unit, wherein
the first and second functional blocks each is configured to,
    store data in a storage device,
    receive an input signal containing configuration information,
    perform at least one operation using a part of the storage device, the at least one operation selected from a plurality of operations based on the configuration information, and
    generate an output signal according to the at least one operation performed, and
the interconnection unit is configured to connect the first functional block and the second functional block based on selected interconnection information from a plurality of pieces of interconnection information, the interconnection unit includes a configuration unit configured to select the interconnection information from the plurality of pieces of interconnection information, the configuration unit including,
    a selector configured to read the plurality of pieces of interconnection information from one of a plurality of internal storage devices selected based on configuration information, and
    a latch configured to store the plurality of pieces of interconnection information read from the selected internal storage device.

28. The logic device of claim 27, wherein
the input signal further includes external information,
the first and second functional blocks are each configured to select the part of the storage device used to perform at least one operation based on the configuration information, and
the first and second functional blocks are each configured to access a portion of data in the selected part of storage device,
the portion of data being selected based on the external information contained in the input signal, and
the first and second functional blocks are each configured to output the portion of data accessed as the output signal.

29. The logic device of claim 28, wherein at least one of the first and second functional blocks are configured,
    to receive the input signal as an 8-bit signal containing the configuration information as a 2-bit signal, and
    to perform one of a ECC operation, an ALU operation, a compression operation, and a security operation in response to the 2-bit signal of configuration information.

30. The logic device of claim 29, wherein the storage device of the at least one of the first and second functional blocks includes a plurality of reconfigurable non-volatile memory devices separated into first to fourth groups, and
the at least one of the first and second functional blocks being is configured to use,
    the first group for performing the ECC operation,
    the second group for performing the ALU operation,
    the third group for performing the compression operation, and
    the fourth group for performing the security operation.

31. The logic device of claim 27, wherein the first and second functional blocks are each configured to
    receive the input signal containing the configuration information as a 1-bit signal, and
    perform two operations in response to the 1-bit signal of configuration information.

32. The logic device of claim 27, wherein the logic device includes a plurality of the logic blocks, and
the logic device further includes a plurality of connection blocks including a plurality of connection units configured to connect the plurality of logic blocks, based on a plurality of pieces of connection information, wherein each of the plurality of plurality of connection units is configured to,
    receive the configuration information,
    select one piece of connection information from among the plurality of pieces of connection information based on the configuration information, and
    connect the plurality of logic blocks based on the selected connection information.

33. A semiconductor package comprising:
a semiconductor chip comprising the logic device of claim 27; and
at least one external terminal connected to the semiconductor chip and configured to receive the input signal containing the configuration information.

* * * * *